(12) United States Patent
Kim et al.

(10) Patent No.: US 12,375,599 B2
(45) Date of Patent: Jul. 29, 2025

(54) ELECTRONIC DEVICE COMPRISING ROLLABLE DISPLAY

(71) Applicant: Samsung Electronics Co., Ltd., Gyeonggi-do (KR)

(72) Inventors: Minuk Kim, Suwon-si (KR); Kyunggu Kim, Suwon-si (KR); Jihwan Kim, Suwon-si (KR); Kyungmoon Seol, Suwon-si (KR); Yongjae Song, Suwon-si (KR); Byungduk Yang, Suwon-si (KR); Kyungtae Kim, Suwon-si (KR); Kwangtai Kim, Suwon-si (KR); Donghyun Yeom, Suwon-si (KR); Jaebong Chun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 241 days.

(21) Appl. No.: 18/328,229

(22) Filed: Jun. 2, 2023

(65) Prior Publication Data
US 2023/0388401 A1 Nov. 30, 2023

Related U.S. Application Data

(63) Continuation of application No. PCT/KR2021/018296, filed on Dec. 3, 2021.

(30) Foreign Application Priority Data

Dec. 4, 2020 (KR) .................. 10-2020-0168915
Feb. 25, 2021 (KR) .................. 10-2021-0025736

(51) Int. Cl.
*H04M 1/02* (2006.01)
*G06F 1/16* (2006.01)
(Continued)

(52) U.S. Cl.
CPC ........ *H04M 1/0268* (2013.01); *G06F 1/1652* (2013.01); *G09F 9/301* (2013.01); *H01Q 1/243* (2013.01); *H05K 1/189* (2013.01)

(58) Field of Classification Search
CPC ........ H05K 1/189; H01Q 1/243; G09F 9/301; G06F 1/1652; H04M 1/0268; H04M 1/02
(Continued)

(56) References Cited

U.S. PATENT DOCUMENTS 9,478,866 B2  10/2016 Lahti
9,812,771 B2  11/2017 Sung et al.
(Continued)

FOREIGN PATENT DOCUMENTS

CN     108594934 B   6/2020
EP     2901601 A1    8/2015
(Continued)

OTHER PUBLICATIONS

International Search Report for PCT/KR2021/018296 mailed Mar. 4, 2022, 3 pages.
(Continued)

*Primary Examiner* — Tremesha W Burns
(74) *Attorney, Agent, or Firm* — Nixon & Vanderhye P.C.

(57) ABSTRACT

An electronic device may include a body having a cylindrical shape as a cylindrical housing. The body may include: a first side surface portion extending from one end; and a second side surface portion extending from the other end of the body and disposed in parallel with the first side surface portion. The body may include a rollable display disposed to be rolled in an inner space of the cylindrical housing, and pulled from the inside of the housing to the outside and pushed into the inside of the housing. The electronic device may include radio frequency (RF) transmission lines disposed to traverse an active area of the rollable display on the
(Continued)

rear surface of the rollable display. The electronic device may include a plurality of antennas disposed on one side of the rollable display and electrically connected to a first side of the plurality of RF transmission lines. The electronic device may include a flexible circuit board electrically connected to a second side of the RF transmission lines.

20 Claims, 33 Drawing Sheets

(51) Int. Cl.
  *G09F 9/30*     (2006.01)
  *H01Q 1/24*     (2006.01)
  *H05K 1/18*     (2006.01)

(58) Field of Classification Search
  USPC ........................................................ 361/749
  See application file for complete search history.

(56) References Cited

U.S. PATENT DOCUMENTS

| | | |
|---|---|---|
| 10,326,866 B2 | 6/2019 | Lee et al. |
| 10,701,194 B2 | 6/2020 | Kim et al. |
| 11,019,522 B2 | 5/2021 | Han et al. |
| 2004/0070543 A1 | 4/2004 | Masaki |
| 2005/0170862 A1 | 8/2005 | Fukushima |
| 2007/0057855 A1 | 3/2007 | Mizoguchi |
| 2012/0075152 A1 | 3/2012 | Usui et al. |
| 2015/0145732 A1 | 5/2015 | Minemura et al. |
| 2017/0147189 A1 | 5/2017 | Ryu et al. |
| 2018/0198899 A1 | 7/2018 | Lee |
| 2018/0284935 A1 | 10/2018 | Lee et al. |
| 2019/0041907 A1 | 2/2019 | Kim et al. |
| 2019/0053379 A1 | 2/2019 | Kim et al. |
| 2020/0371558 A1 | 11/2020 | Kim et al. |
| 2021/0021017 A1 | 1/2021 | Li et al. |
| 2021/0219437 A1 | 7/2021 | Kim et al. |
| 2022/0326735 A1 | 10/2022 | Kang et al. |

FOREIGN PATENT DOCUMENTS

| | | |
|---|---|---|
| EP | 3 422 139 A1 | 1/2019 |
| EP | 3 767 427 A1 | 1/2021 |
| JP | 2006-024618 A | 1/2006 |
| JP | 2008-109228 A | 5/2008 |
| KR | 10-2012-0004142 A | 2/2012 |
| KR | 20170006089 A | 1/2017 |
| KR | 20180109543 A | 10/2018 |
| KR | 20190086305 A | 7/2019 |
| KR | 20190143029 A | 12/2019 |
| KR | 102291757 B1 | 8/2021 |
| RU | 2 724 124 C1 | 6/2020 |
| WO | 2020230956 A1 | 11/2020 |

OTHER PUBLICATIONS

Written Opinion of the ISA for PCT/KR2021/018296 mailed Mar. 4, 2022, 5 pages.
Extended European Search Report dated Apr. 5, 2024 for EP Application No. 21901097.2.

Coaxial Cable

Rectangular Waveguide

Circular Waveguide

Microstrip line

Strip line

CPW

<Single CPWG>

<Dual CPWG>

<Single CPW>

<Dual CPW>

<Dual CPS>

ELECTRONIC DEVICE COMPRISING ROLLABLE DISPLAY

CROSS-REFERENCE TO RELATED APPLICATIONS

This application is a continuation of International Application No. PCT/KR2021/018296, designating the United States, filed on Dec. 3, 2021, in the Korean Intellectual Property Receiving Office, and claiming priority to KR Patent Application No. 10-2020-0168915 filed on Dec. 4, 2020, and KR Patent Application No. 10-2021-0025736 filed on Feb. 25, 2021, in the Korean Intellectual Property Office, the disclosures of all of which are hereby incorporated by reference herein in their entireties.

BACKGROUND

Field

Various example embodiments relate to an electronic device including a rollable display.

Description of Related Art

Electronic devices that can be folded or unfolded by applying a flexible display (e.g., a foldable phone) and electronic devices that extend the flexible display in a sliding manner (e.g., a slidable phone) are being developed. In addition, electronic devices whose screen can be rolled or unfolded by applying a rollable display (e.g., a rollable phone) is being developed.

In the form factor of an electronic device to which a rollable display is applied, there is a problem of insufficient mounting space for radio frequency (RF) components and antennas. The electronic device (e.g., the rollable phone) has a limited space to include the antenna, and so a method of arranging the antenna in an area other than the area (e.g., the rolling area) where the display rolls may be considered. However, if the antenna is disposed in an area other than the rolling area, a difficult problem may occur in implementing a rollable form factor.

SUMMARY

An electronic device according to various example embodiments may include an RF component and an antenna in a rolling area in a form factor of an electronic device to which a rollable display is applied. An electronic device according to various example embodiments may dispose the antenna at the end of the display and dispose at least a portion of RF transmission line connecting antenna and flexible printed circuit board (FPCB) on the rear surface of the display or in a non-display area (e.g., a BM area) of the front surface of the display.

Technical problems to be solved are not limited to the aforementioned technical problems, and other technical problems not described above may be easily understood from the following description by a person having ordinary knowledge in the art to which the disclosure pertains.

An electronic device according to an example embodiment may include a body having a cylindrical shape as a cylindrical housing. The body may include: a first side surface portion extending from one end; and a second side surface portion extending from the other end of the body and disposed in parallel with the first side surface portion. The body may include a rollable display disposed to be rolled in an inner space of the cylindrical housing, and pulled from the inside of the housing to the outside and pushed into the inside of the housing. The electronic device according to an example embodiment may include radio frequency (RF) transmission lines disposed to traverse an active area of the rollable display on (directly or indirectly) the rear surface of the rollable display. The electronic device according to an example embodiment may include a plurality of antennas disposed on (directly or indirectly) one side of the rollable display and electrically connected (directly or indirectly) to a first side of the plurality of RF transmission lines. The electronic device according to an example embodiment may include a flexible circuit board electrically connected (directly or indirectly) to a second side of the RF transmission lines.

An electronic device according to an example embodiment may include a body having a cylindrical shape as a cylindrical housing. The main body may include a first side surface portion extending from one end; a second side surface portion extending from the other end of the main body and disposed in parallel with the first side surface portion; and a rollable display that is disposed to be rolled in an inner space of the cylindrical housing, and pulled from the inside of the housing to the outside and pushed into the inside of the housing. An electronic device according to an example embodiment may include radio frequency (RF) transmission lines disposed in the non-display area of the rollable display on the front of the rollable display. An electronic device according to an example embodiment may be disposed on one side of the rollable display and include a plurality of antennas electrically connected (directly or indirectly) to the first side of the plurality of RF transmission lines. An electronic device according to an example embodiment may include a flexible circuit board electrically connected to a second side of the RF transmission lines.

An electronic device according to various example embodiments may include an RF component and/or an antenna in the rolling area of the electronic device by disposing the antenna at the end of the display and disposing an RF transmission line connecting the antenna and the FPCB on the rear surface of the display.

An electronic device according to various example embodiments may include an RF component and/or an antenna in the rolling area of the electronic device by disposing the antenna at the end of the display and disposing an RF transmission line connecting antenna and FPCB in a non-display area (e.g., a BM area) of the front surface of the display.

In addition to this, various effects identified directly or indirectly through this document may be provided.

BRIEF DESCRIPTION OF DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
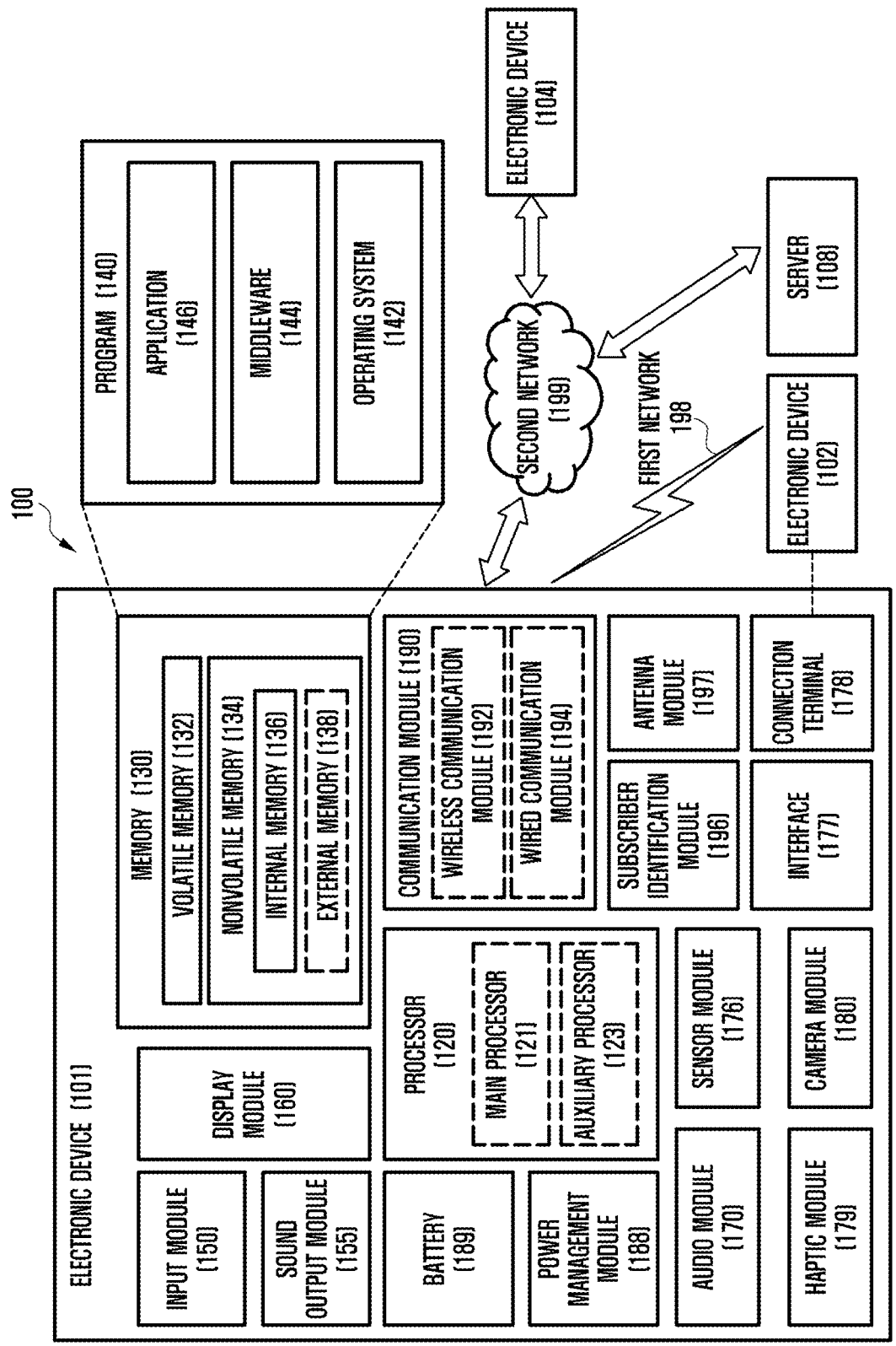
FIG. 1 is a block diagram of an electronic device in a network environment according to various example embodiments.

FIG. 1 is a block diagram illustrating an electronic device 101 in a network environment 100 according to various embodiments. With reference to FIG. 1a, the electronic device 101 in the network environment 100 may communicate with an electronic device 102 via a first network 198 (e.g., a short-range lineless communication network), or at least one of an electronic device 104 or a server 108 via a second network 199 (e.g., a long-range lineless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120 and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., linedly) or linelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., linedly) or linelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., lined) communication channel or a lineless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., lined) communication or a lineless communication. According to an embodiment, the communication module 190 may include a lineless/wireless communication module 192 comprising communication circuitry (e.g., a cellular communication module, a short-range lineless communication module, or a global navigation satellite system (GNSS) communication module) or a wired/lined communication module 194 comprising communication circuitry (e.g., a local area network (LAN) communication module or a power line communication (PLC) module). A corresponding one of these communication modules may communicate with the external electronic device via the first network 198 (e.g., a short-range communication network, such as Bluetooth™, lineless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The lineless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The lineless communication module 192 may support a high-frequency band (e.g., the mmWave band) to achieve, e.g., a high data transmission rate. The lineless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The lineless communication module 192 may support various requirements specified in the electronic device 101, an external electronic device (e.g., the electronic device 104), or a network system (e.g., the second network 199). According to an embodiment, the lineless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the lineless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108 For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., linedly), linelessly, or via at least a third element(s).

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC). Thus, each "module" herein may comprise circuitry.

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively, or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
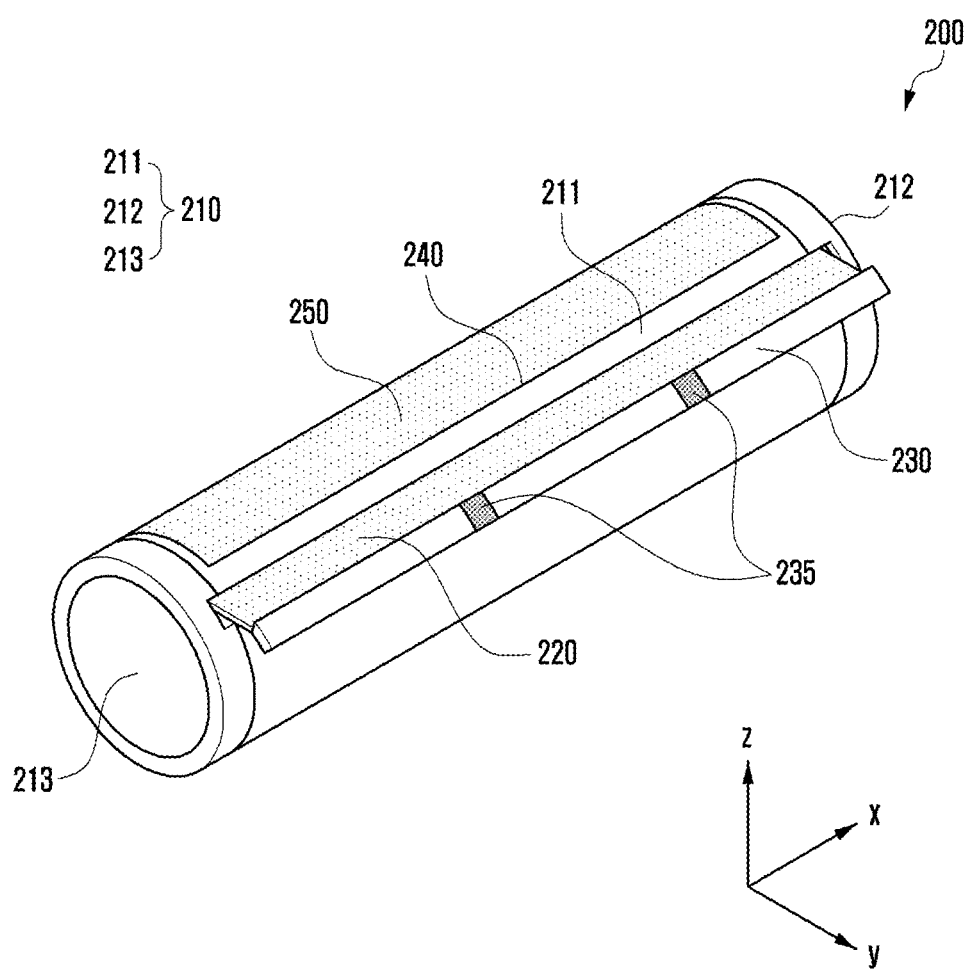
FIG. 2 is a perspective view illustrating a contracted state (e.g., a slide-in state) (e.g., a rolling-in state) of the electronic device according to various example embodiments.
Figure 3:
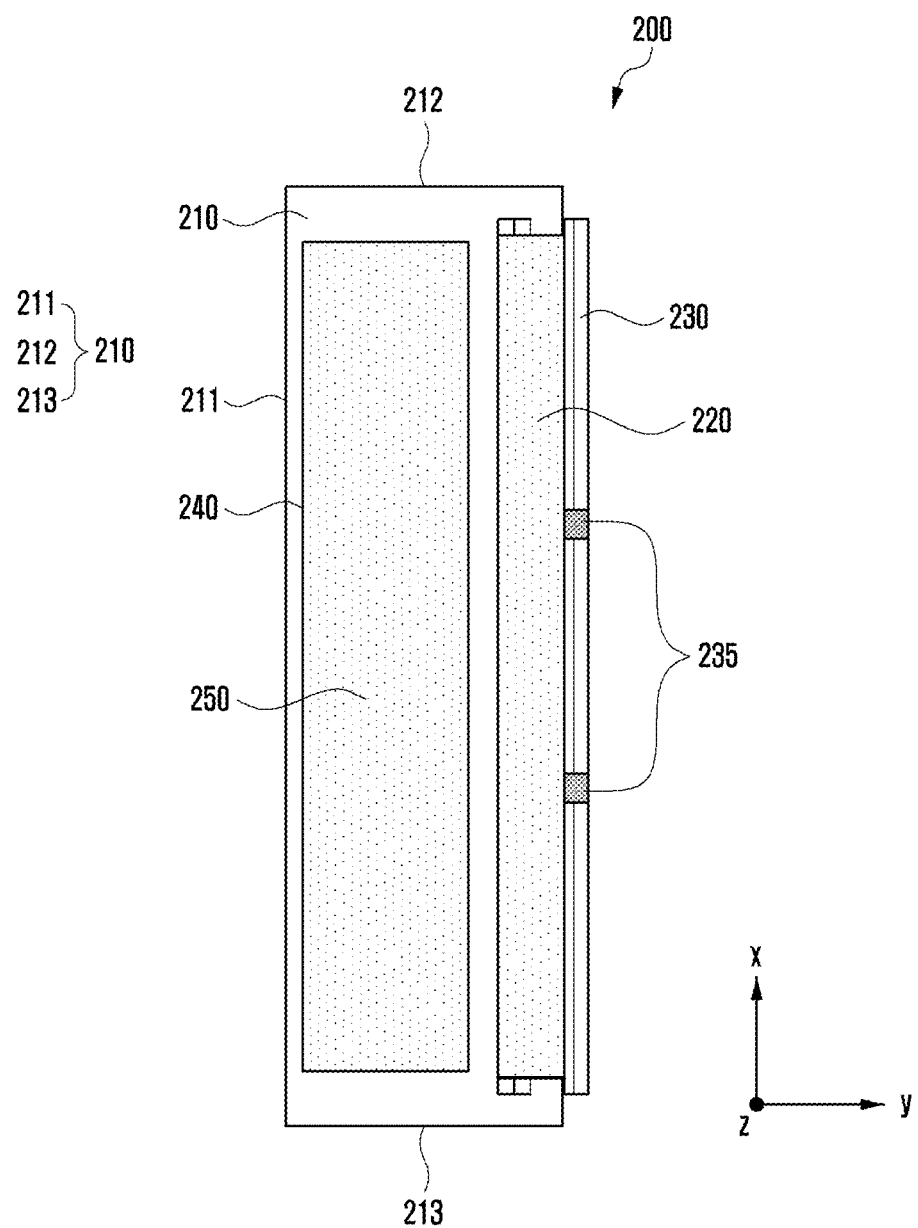
FIG. 3 is a plane view illustrating a contracted state of an electronic device according to various example embodiments.

FIG. 2 is a perspective view illustrating a contracted state (e.g., a slide-in state) (e.g., a rolling-in state) of the electronic device according to various embodiments. FIG. 3 is a plane view illustrating a contracted state of an electronic device according to various embodiments. FIG. 2 and FIG. 3 illustrate a front surface (e.g., the surface on which the screen is displayed) of the electronic device 200 in a contracted state of the electronic device 200.

Figure 4:
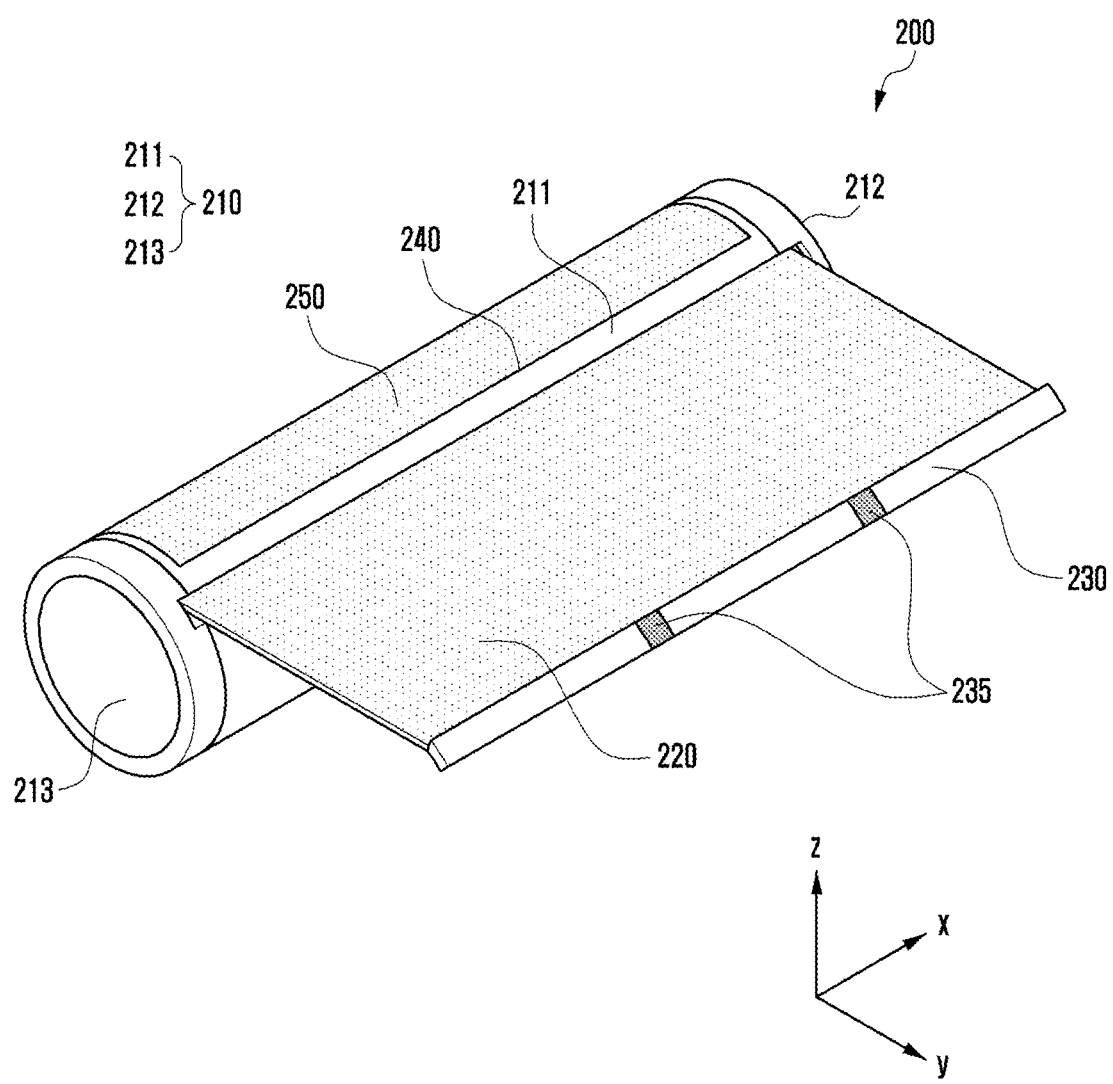
FIG. 4 is a perspective view illustrating an expanded state (e.g., a slide-out state) (e.g., a rolling-out state) of the electronic device according to various example embodiments.
Figure 5:
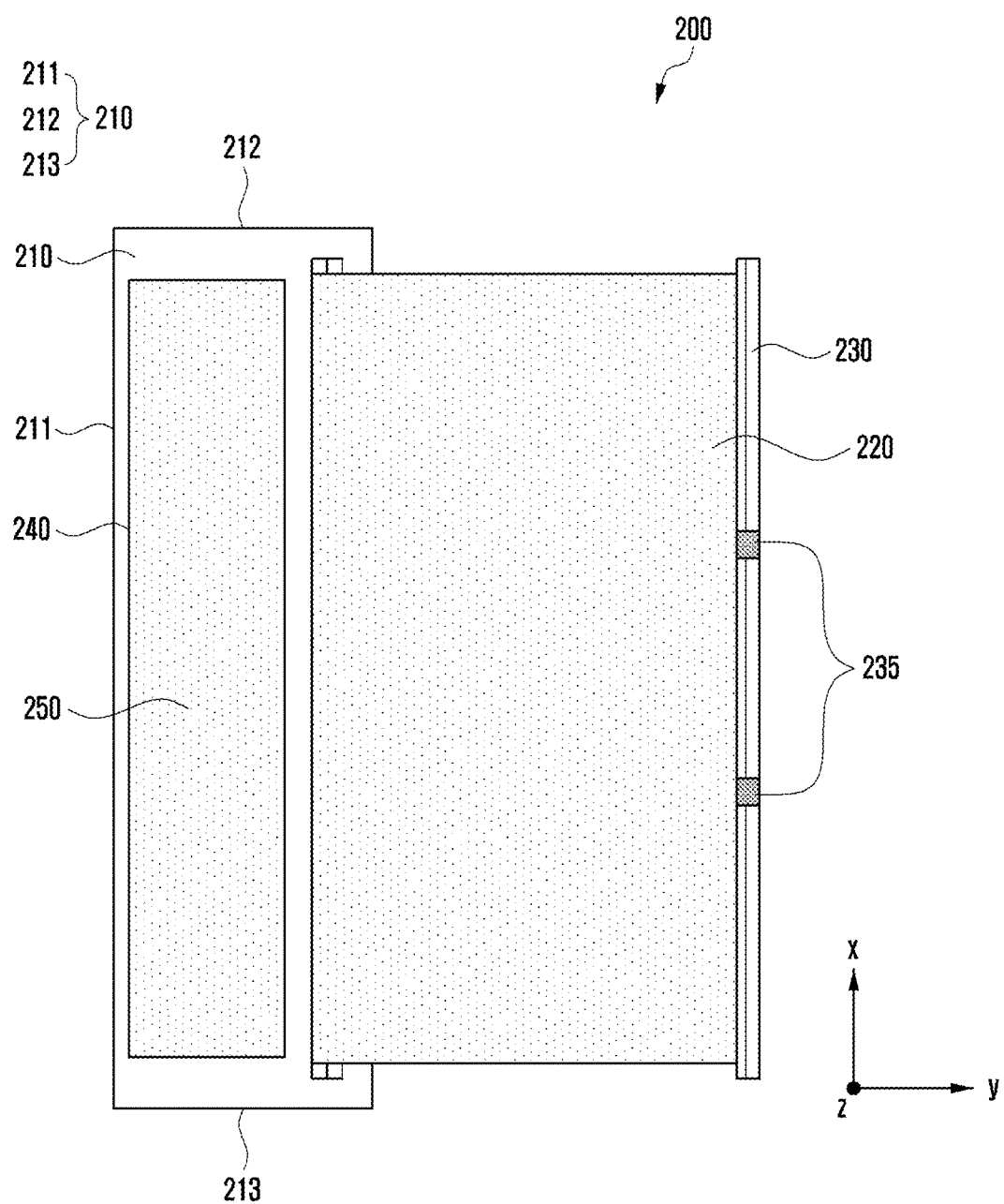
FIG. 5 is a plane view illustrating an expanded state of an electronic device according to various example embodiments.

FIG. 4 is a perspective view illustrating an expanded state (e.g., a slide-out state) (e.g., a rolling-out state) of the electronic device according to various embodiments. FIG. 5 is a plane view illustrating an expanded state of an electronic device according to various embodiments. FIG. 4 and FIG. 5 illustrate a front surface (e.g., the surface on which the screen is displayed) of the electronic device 200 in an expanded state of the electronic device 200.

With reference to FIGS. 2 to 5, an electronic device 200 according to various embodiments may include a cylindrical housing 210 having a space therein; a first display 220 (e.g., a main display); a plurality of antennas 230; and a second display 250 (e.g., a sub-display) disposed inside the cylindrical housing 210. The first display 220 may be a flexible display that may be rolled inside the cylindrical housing 210. The second display 250 may be a flexible display disposed to correspond to the shape of the cylindrical housing 210.

According to an embodiment, a plurality of antennas 230 may be disposed at one end of one side (e.g., the Y-axis direction) of the first display 220. A plurality of antennas 230 may be segmented as an insulator 235 is disposed between the plurality of antennas 230.

According to an embodiment, the cylindrical housing 210 may include a body 211 having a cylindrical shape; a first side surface portion 212 disposed on one end of the body 211 and coupled to the body 211 or integrally formed with the body 211; and a second side surface portion 213 disposed at the other end of the body 211 and coupled to the body 211 or integrally formed with the body 211.

According to an embodiment, the first side surface portion 212 may extend from one end of the body 211. According to an embodiment, the second side surface portion 213 may extend from the other end of the main body 211. According to an embodiment, the first side surface portion 212 and the second side surface portion 213 may be disposed substantially side by side.

According to an embodiment, the electronic device 200 may include a second display 250 visually exposed to the outside through a slit 240 in which at least a portion of the main body 211 of the housing 210 is opened.

According to an embodiment, the second display 250, regardless of whether the electronic device 200 is in a contracted state or an expanded state, may be exposed to the outside in a fixed manner. For example, the second display 250 may be visually exposed to the outside in a fixed manner by being exposed to the outside through the slit 240 formed in the main body 211.

According to an embodiment, the second display 250 may be exposed in a fixed manner to the outside by being visually exposed to the outside through at least a portion of the surface of the main body 211. For example, the second display 250 may be seated in a recess (not shown) formed on at least a portion of the surface of the body 211 and may be disposed to occupy a portion of the area of the body 211.

According to an embodiment, as the surface of the main body 211 has a curved surface, the second display 250 may include a curved surface having a curvature similar to that of the surface of the main body 211. In some embodiments, the second display 250 may have a flat shape, and in this case, a flat support surface (not shown) for supporting the second display 250 may be formed on the surface of the main body 211.

According to an embodiment, a slit-shaped hole through which the first display 220 is pulled out from and pushed into the inner space of the housing 210 may be formed in the main body 211 of the housing 210. According to an embodiment, the slit-shaped hole may be formed in a long bar shape in a first direction (e.g., an X-axis direction).

According to an embodiment, the first display 220 may be disposed in the inner space of the housing 210. According to an embodiment, the first display 220, as a rollable display, may be disposed to be rolled in the inner space of the housing, and be pulled out from the inside to the outside of the housing 210 or be pushed into from the outside to the inside of the housing 210 in conjunction with the rotation of the rotation shaft. According to an embodiment, the first display 220 may be pulled out of the housing in a second direction (e.g., the Y-axis direction) substantially perpendicular to the first direction (e.g., the X-axis direction).

According to an embodiment, the electronic device 200, in an expanded state, the first display 220 may be pulled out by a specified length in a direction (e.g., the Y-axis direction) substantially perpendicular to the first direction (e.g., the X-axis direction) from the main body 211 of the housing 210.

According to an embodiment, when the electronic device 200 is in a contracted state, the first display 220 may be disposed inside the main body 211 of the housing 210. For example, when the electronic device 200 is converted from an expanded state to a contracted state, at least a portion of the first display 220 may be pushed into the inner space of the housing 210 through the slit-shaped hole while moving in a third direction (e.g., the −Y-axis direction) opposite to the second direction (e.g., the Y-axis direction). For example, in an expanded state of the electronic device 200, the display area of the first display 220 may be visually exposed to the outside.

According to an embodiment, the housing 210 may provide an internal space in which various components (e.g., a printed circuit board, an antenna module, a sensor module, and/or a battery) of the electronic device 200 may be disposed. In an embodiment, at least some of the various parts of the electronic device 200 disposed in the inner space of the housing 210 may be visually exposed to the outside through the surface of the main body 211 of the housing 210.

According to an embodiment, the parts visually exposed from the outside of the main body 211 may include a camera module (e.g., the camera module 180 of FIG. 1), a sound output module (e.g., the sound output module 155 of FIG. 1), and/or sensors (e.g., the sensor module 176 of FIG. 1). According to an embodiment, the sensors may include at least one of a receiver, a proximity sensor, an ultrasonic sensor, a gesture sensor, a gyro sensor, an air pressure sensor, a magnetic sensor, an acceleration sensor, a grip sensor, a color sensor, an infrared (IR) sensor, a biometric sensor, and a temperature sensor, a humidity sensor, or an illuminance sensor. For example, at least some of the components may be disposed under the second display 250 or visually exposed to the outside through a partial area of the second display 250. As an example, an indicator may be disposed to be visually exposed to the outside of the main body 211.

According to an embodiment, the contracted state of the electronic device 200 may be defined as a state invisible from the outside according to the situation that the first display 220 of the electronic device 200 is rolled inside the cylindrical housing 210. FIG. 2 and FIG. 3 show a state in which a portion of the first display 220 is exposed to the outside of the housing 210 for ease of understanding, but in a contracted state in which the first display 220 is completely rolled inside the housing 210, the first display 220 may not be exposed to the outside.

According to an embodiment, the expanded state of the electronic device 200 may be defined as a state that the first display 220 is visible from the outside as the first display 220 of the electronic device 200 is pulled out of the housing 210.

According to an embodiment, the front of the electronic device 200 may be defined as a direction in which the electronic device 200 is viewed in a substantially vertical direction (e.g., the Z-axis direction) from a portion of the front (e.g., the surface on which a screen is displayed) of the second display 250 of the electronic device 200. The front of the electronic device 200 in an expanded state of the electronic device 200 may be defined as a direction in which the electronic device is viewed in a substantially vertical direction (e.g., the Z-axis direction) from a portion of the front (e.g., the surface on which a screen is display) of the first display 220 is the front of the first display 220. The front of the electronic device 200 may be defined as a direction in which the electronic device 200 is viewed from a direction (e.g., the Z-axis direction) substantially perpendicular to the planes on which the screens of the first display 220 and the second display 250 are displayed.

According to an embodiment, the rear surface of the electronic device 200 may be defined as a direction in which the screen of the first display 220 is not visible in an expanded state of the electronic device 200, and which is opposite (e.g., −Z axis direction) to the front surface of the electronic device 200.

According to an embodiment, the rear surface of the electronic device 200 may be defined as a direction in which the second display 250 of the electronic device 200 is not visible from the outside, and which is opposite (e.g., −Z axis direction) to the front surface of the electronic device 200.

According to an embodiment, each of the first side surface portion 212 and the second side surface portion 213 may include at least one conductive portion and at least one non-conductive portion. According to an embodiment, the non-conductive portion may be formed of an injection-molded material.

According to an embodiment, the conductive portion may include a metal material and may be used as an antenna radiator for cellular communication or short-distance communication (e.g., WiFi).

According to an embodiment, the plurality of antennas 230 may be disposed at one end of one side (e.g., the Y-axis direction) of the first display 220. The plurality of antennas 230 may be formed by segmenting a metal frame supporting the first display 220.

According to an embodiment, the plurality of antennas 230 may be formed by forming a metal layer and/or an insulating layer on at least a portion of the first display 220.

According to an embodiment, a first antenna of a plurality of antennas 230 may be an antenna that linelessly communicates with a designated first frequency.

According to an embodiment, a second antenna of a plurality of antennas 230 may be an antenna that linelessly communicates with a designated second frequency.

According to an embodiment, a third antenna of a plurality of antennas 230 may be an antenna that linelessly communicates with a designated third frequency.

According to an embodiment, the first frequency may be a communication frequency of Sub6 (6 GHz or less) band for 5G communication. According to an embodiment, the first frequency may further include a communication frequency for a second generation (2G), 3G, 4G, or long term evolution (LTE) network.

According to an embodiment, the second frequency may be a communication frequency of a super-high frequency (e.g., mmWave (e.g., 28 gigabytes (28 GHz)) or 39 gigabytes (39 GHz)) band for 5G communication.

According to an embodiment, the third frequency may be a communication frequency of 2.4 GHz or 5 GHz ISM band for the purpose of Bluetooth or WiFi communication.

Figure 6:
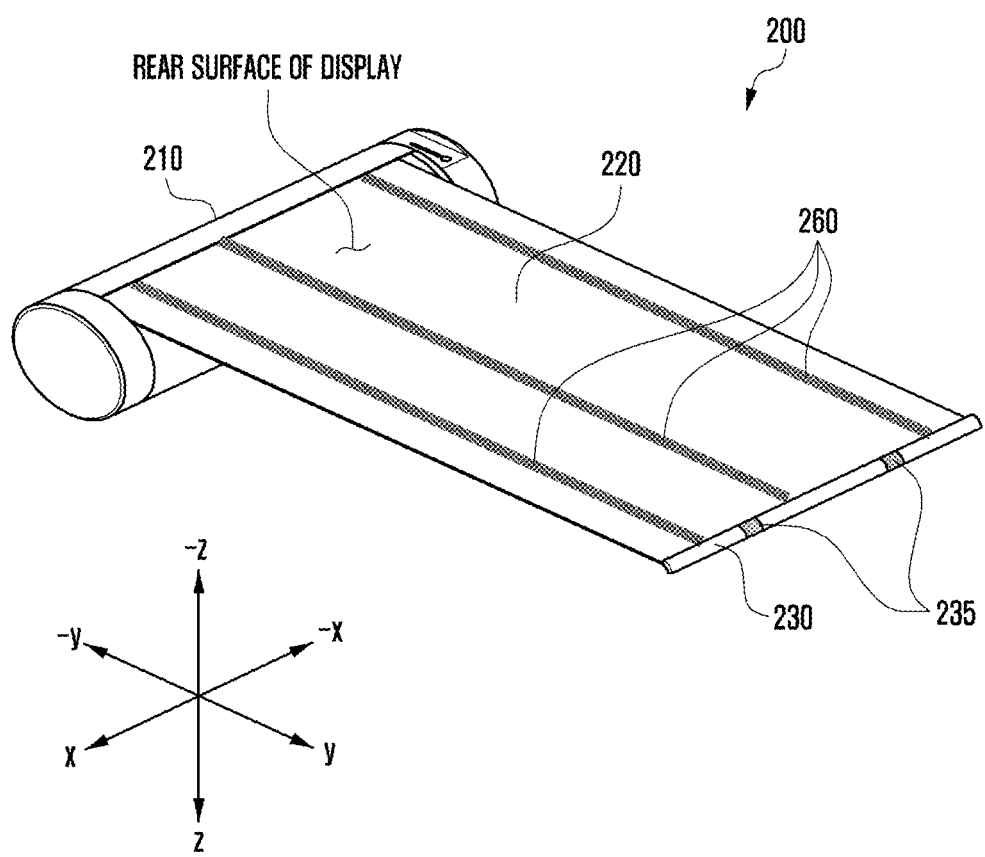
FIG. 6 is a diagram illustrating example RF transmission lines disposed on a rear surface of a display.
Figure 7:
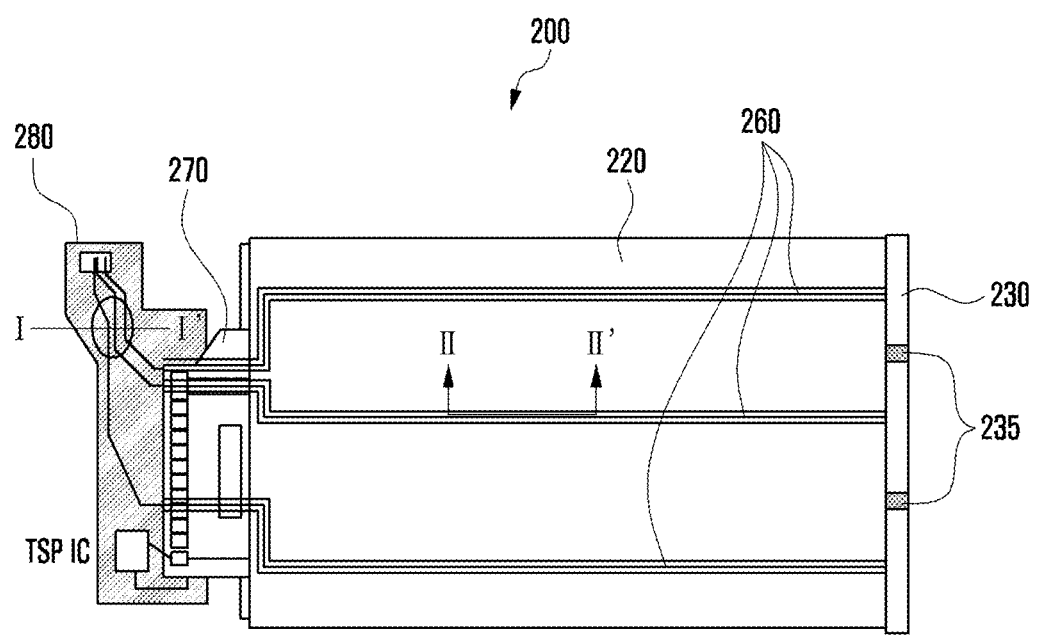
FIG. 7 is a diagram illustrating an example connection structure between RF transmission lines and a printed circuit board.

FIG. 6 is a diagram illustrating RF transmission lines 260 disposed on (directly or indirectly) a rear surface of the first display 220 (e.g., the main display). FIG. 7 is a diagram illustrating a connection structure between RF transmission lines 260 and a printed circuit board 280 (e.g., FPCB).

With reference to FIGS. 6 and 7, RF transmission lines 260 may be disposed on at least a portion of the rear surface of the first display 220. According to an embodiment, the RF transmission lines 260 may be disposed to correspond to the number of the plurality of antennas 230.

Figure 10:
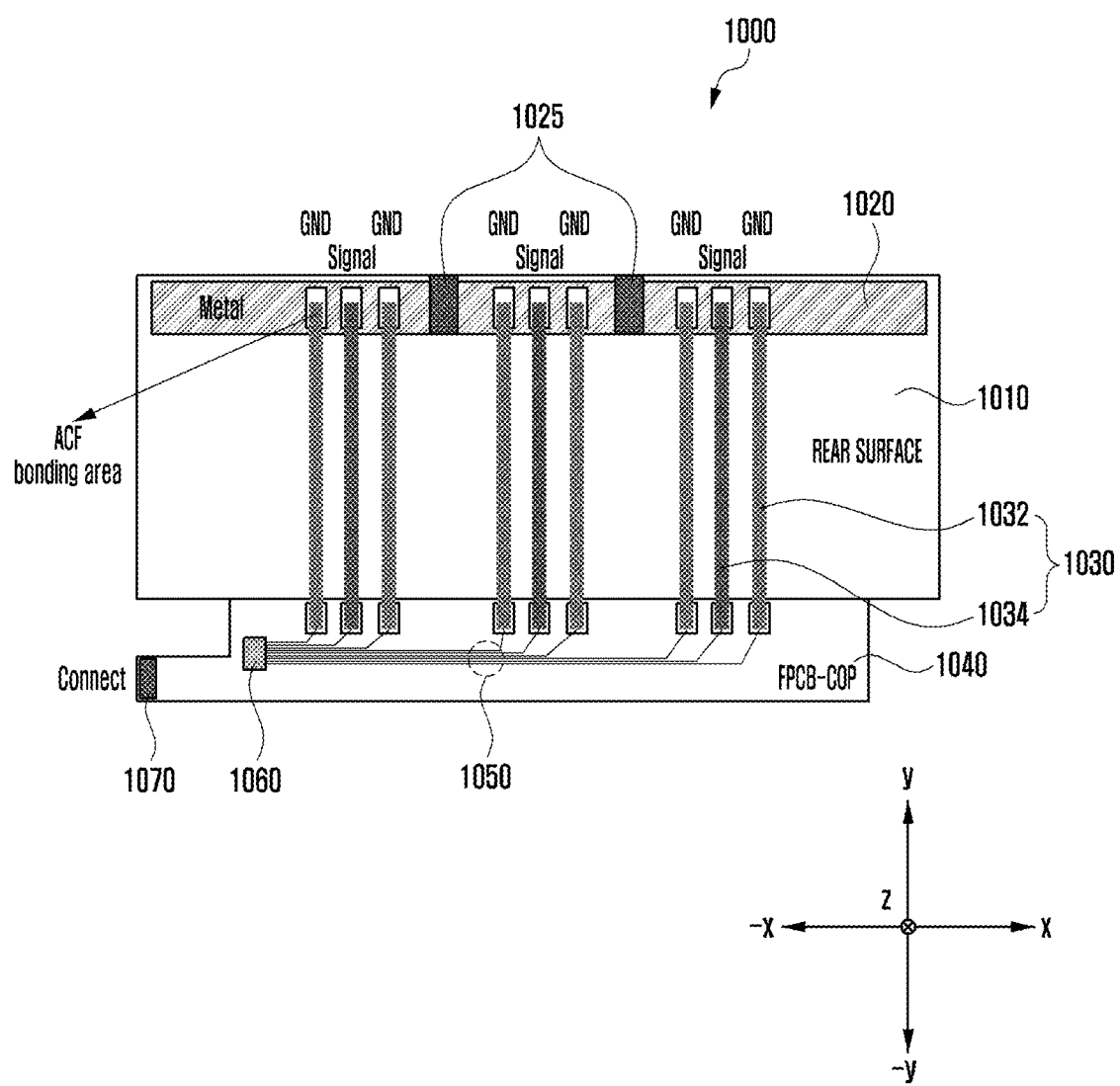
FIG. 10 is a diagram illustrating a disposition form of RF transmission lines according to various example embodiments.

According to an embodiment, the RF transmission lines 260 may include ground lines (e.g., ground lines 1032 of FIG. 10) and RF signal lines (e.g., RF signal lines 1034 of FIG. 10). As an example, ground lines (e.g., ground lines 1032 of FIG. 10) and RF signal lines (e.g., RF signal lines 1034 of FIG. 10) may be alternately disposed.

According to an embodiment, the RF transmission lines 260 may be formed by combining a 50 ohm transmission line (e.g., co-planar wave guide (CPW), or a strip line).

According to an embodiment, a 50 ohm transmission line may be formed by at least partially bonding a co-planar wave guide (CPW) or a s trip line to the rear surface of the first display 220.

According to an embodiment, a 50 ohm transmission line may be formed by vapor depositing a co-planar wave guide (CPW) or a strip line on at least a portion of the rear surface of the first display 220.

According to an embodiment, RF transmission lines 260 may be formed as a structure of a flexible type CPW or a strip line on a separate FPCB, and the formed RF transmission lines 260 may be coupled to the rear surface of the first display 220. For example, a 50 ohm connection method may configure a line (Signal) and/or a ground (GND) according to the structure of a CPW or a strip line.

According to an embodiment, the RF transmission lines 260 may be disposed in a straight-line form from one side (e.g., the side where the antenna 230 is disposed) to the other side (e.g., the side where the FPCB 280 is disposed) of the first display 220.

As an example, when the electronic device 200 is in an expanded state, the RF transmission lines 260 may be disposed in a form traversing the rear surface of the active area (e.g., the area where the screen is displayed) of the first/main display 220 in the first direction (e.g., the X-axis direction).

According to an embodiment, the first side of the RF transmission lines 260 may be electrically connected (directly or indirectly) to the plurality of antennas 230. The second side of the RF transmission lines 260 may be electrically connected to a chip on panel (COP) unit 270 (e.g., a COP bending unit). The COP unit 270 may be electrically connected to the FPCB 280. According to an embodiment, a touch driver (e.g., the touch screen panel integrated circuits (TSP IC)) for driving a touch sensor (e.g., the touch sensor 914 of FIG. 9) may be disposed in the FPCB 280.

As an example, the RF transmission lines 260 and the plurality of antennas 230 may be connected using an anisotropic conductive film (ACF) bonding method.

According to an embodiment, the FPCB 280 electrically connected to the RF transmission lines 260 may be electrically connected to the main PCB of the electronic device 200.

According to an embodiment, an antenna module (e.g., the antenna module 197 of FIG. 1) may be disposed on (directly or indirectly) the main PCB, and a plurality of the antennas 230 may be electrically connected to the antenna module via the RF transmission lines 260 and the FPCB 280.

According to an embodiment, the FPCB 280 may include an area having a bendable or flexible feature (hereinafter referred to as a "flexible area"). In an example, the flexible area may include a base film (or substrate) and a copper foil layer. For example, the flexible area may be a flexible copper clad laminate (FCCL) film in which at least one copper clad is laminated on at least a portion of at least one area of the top and/or bottom of a polyimide film or polyester film.

Figure 8:
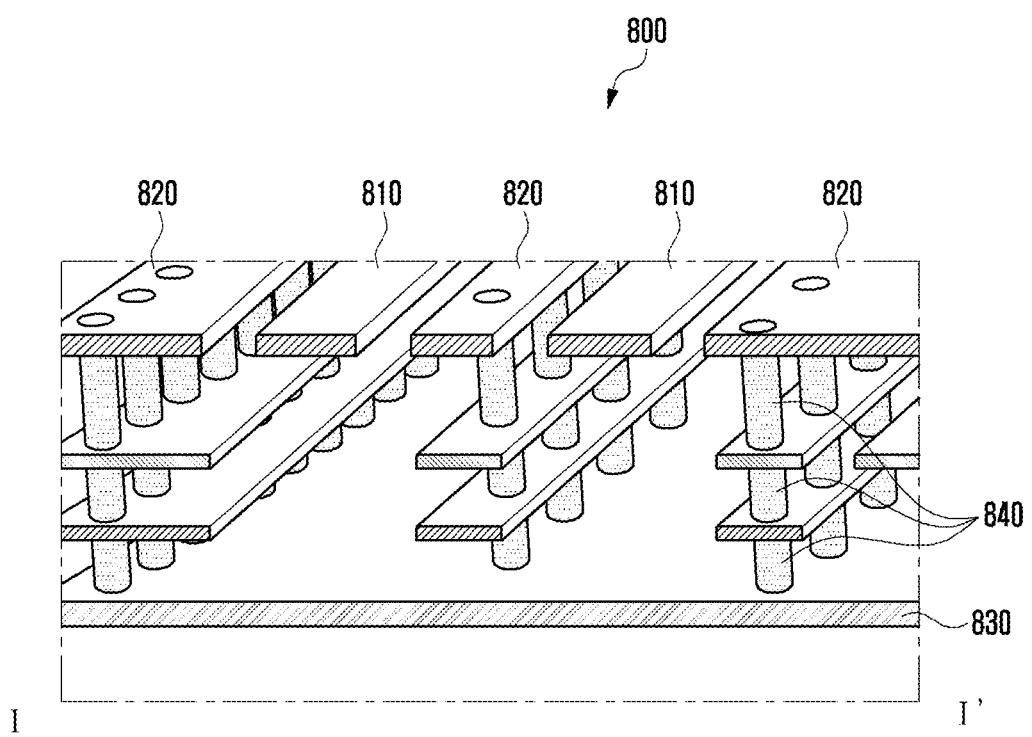
FIG. 8 is a cross-sectional view taken along the line I-I' shown in FIG. 7.
Figure 9:
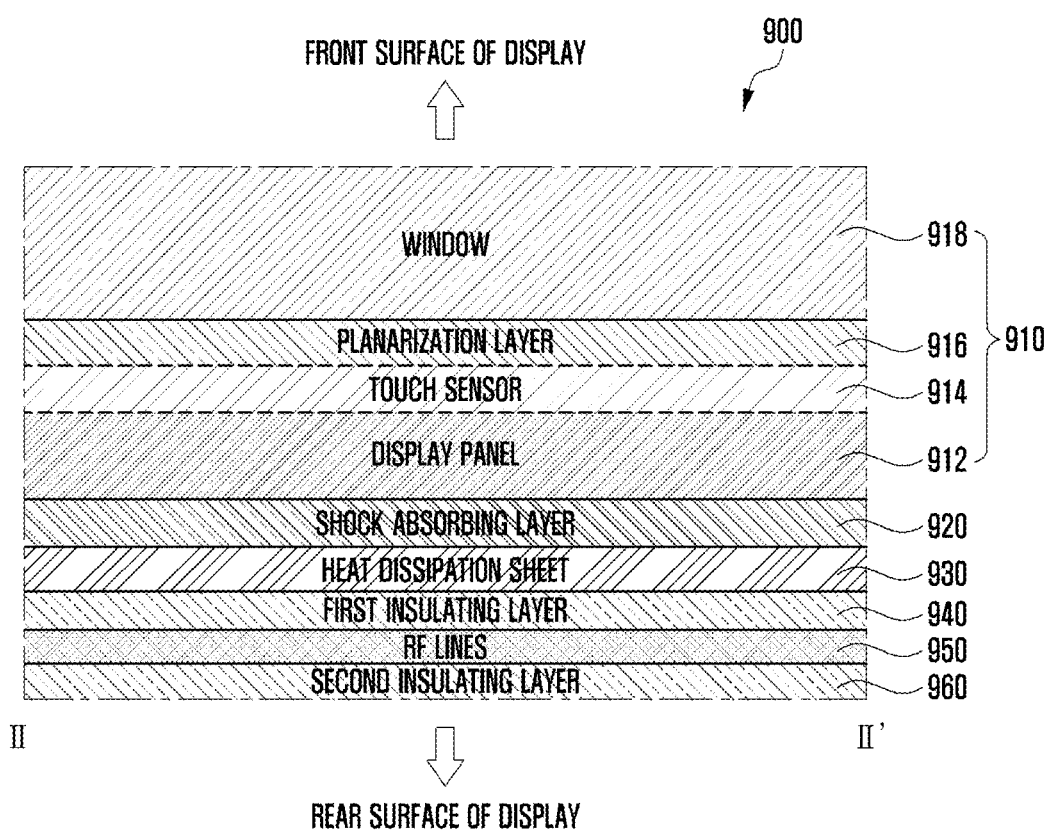
FIG. 9 is a cross-sectional view taken along line II-II' shown in FIG. 7.

FIG. 8 is a cross-sectional view 800 taken along the line I-I' shown in FIG. 7. FIG. 9 is a cross-sectional view 900 taken along line II-II' shown in FIG. 7. FIG. 10 is a diagram 1000 illustrating a disposition form of RF transmission lines according to various embodiments.

With reference to FIGS. 8 to 10, a plurality of antennas 1020 made of metal may be disposed on (directly or indirectly) one side of the display 1010 (e.g., the first display 220 of FIGS. 6 and 7). A plurality of antennas 1020 may be segmented as an insulator 1025 (e.g., the insulator 235 of FIGS. 6 and 7) is disposed between the plurality of antennas 1020 (e.g., the plurality of antennas 230 of FIGS. 6 and 7).

The RF transmission lines 1030 may include ground lines 1032 and/or RF signal lines 1034. Ground lines 1032 and/or RF signal lines 1034 may be disposed in a form traversing the rear surface of the active area (e.g., the area where the screen is displayed) of the display 1010 (e.g., the first display 220 of FIGS. 6 and 7) in the first direction (e.g., the Y-axis direction), and they may be electrically connected to the FPCB (e.g., the FPCB 280 of FIG. 7) via the COP unit 1040.

As an embodiment, the number of RF signal lines 1034 may not match the number of antennas (antenna radiators) formed by the segmentation portion 1025 (e.g., the insulating segmentation portion 235 of FIG. 2). For example, the number of RF signal lines 1034 and the number of antennas 1020 corresponding to the RF signal lines 1034 may be formed to be different from each other.

A plurality of contact lines 1050 electrically connected to the ground line 1032 and the RF signal line 1034 may be disposed in the COP unit 1040, and a plurality of contact lines 1050 may be connected to the contact unit 1060.

Inside the COP unit 1040, a plurality of lines connecting the contact unit 1060 and the connector 1070 may be disposed, and they may be electrically connected to the FPCB (e.g., the FPCB 280 of FIG. 7) via the connector 1070.

As shown in FIG. 8, the ground line 820 (e.g., the ground line 1032 of FIG. 10) and the RF signal line 810 (e.g., the RF signal line 1034 of FIG. 10) may be disposed alternately. For example, the ground line 820 and the RF signal line 810 may be substantially disposed on the same plane. The ground line 820 may be electrically connected to the ground terminal 830 through the via 840.

According to various embodiments, the via 840 may be a through-hole plated with a conductive material. According to an embodiment, the via 840 may be electrically connected to the ground line 820 and/or the ground terminal 830. A plated through hole (PTH) may be included. According to various embodiments, the via 840 may be implemented as a laser via hole (LVH), a buried via hole (BHV), or a stacked via.

According to various embodiments, a first ground terminal and a second ground terminal disposed on different floors may be electrically connected through a via. According to various embodiments, a plurality of ground terminals disposed on different layers may be electrically connected through a plurality of vias.

As shown in FIG. 9, RF transmission lines 950 (e.g., the RF transmission lines 260 of FIGS. 6 and 7) may be disposed on (directly or indirectly) the rear surface of the display 910 (e.g., the first display 220 of FIGS. 6 and 7).

According to an embodiment, the main display 910 may include a display panel 912, a touch sensor 914, a planarization layer 916, and a window 918. Here the display panel 912 may be an OLED panel.

According to an embodiment, a touch sensor 914 may be disposed on (directly or indirectly) the display panel 912. A planarization layer 916 may be disposed on the touch sensor 914. A window 918 may be disposed on the planarization layer 916. As an example, the touch sensor 914 may be implemented with a transparent conductive layer (or transparent conductive film) including a conductive material such as indium tin oxide (ITO). As an example, the touch sensor 914 may not be limited to the illustrated form, but it may be disposed as an add-on type, an on-cell type, or an in-cell type.

According to an embodiment, a shock absorbing layer 920 may be disposed under the display panel 912. A heat dissipation sheet 930 may be disposed under the shock absorbing layer 920. A first insulating layer 940 may be disposed under the heat dissipation sheet 930. RF transmission lines 950 may be disposed under the first insulating layer 940. A second insulating layer 960 may be disposed under the RF transmission lines 950. In the rear surface of the first display 220, the RF transmission lines 950 may be disposed between the first insulating layer 940 and he second insulating layer 960.

According to various embodiments, the insulating layers 940 and 960 may be formed of various materials. For example, the insulating layers 940 and 960 may include at least one of polyimide, polytetrafluoroethylene, or polyester.

Figure 11A:
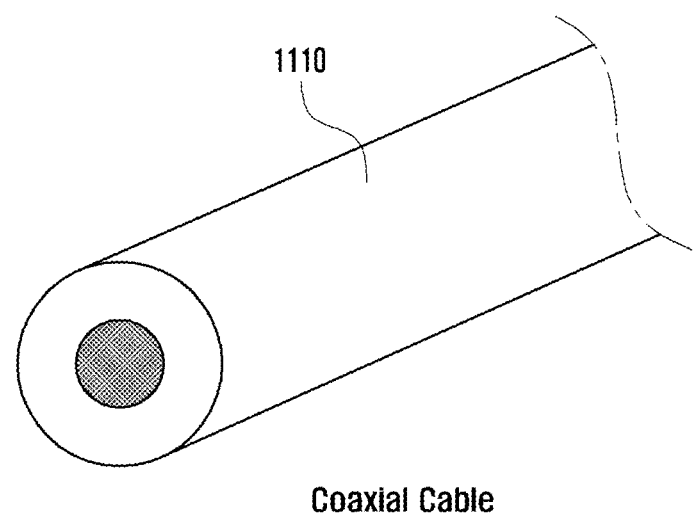
FIG. 11A to 11C are diagrams illustrating RF transmission lines according to various example embodiments.
Figure 11B:
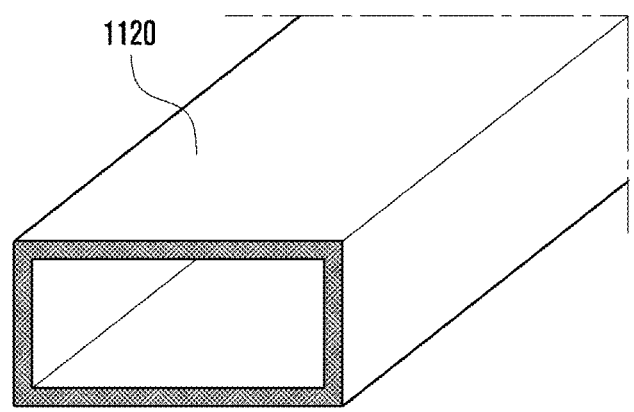
Figure 11C:
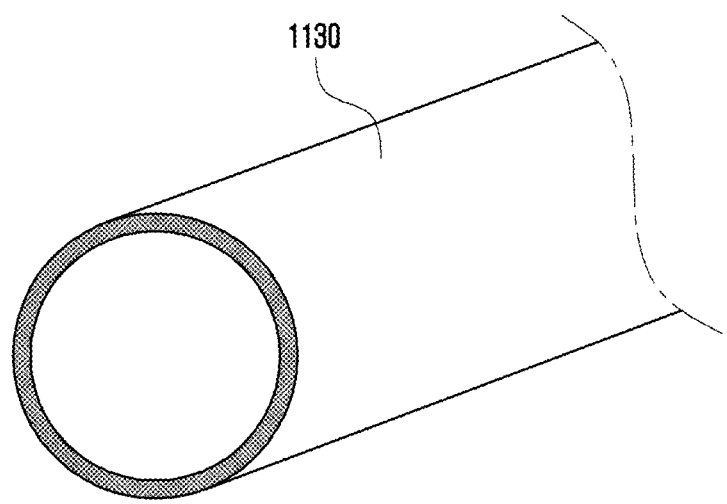
Figure 12A:
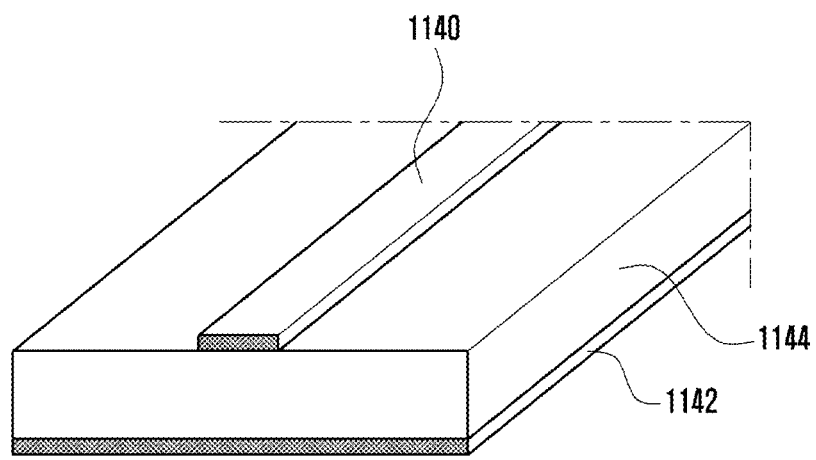
FIG. 12A to 12C are diagrams illustrating RF transmission lines according to various example embodiments.
Figure 12B:
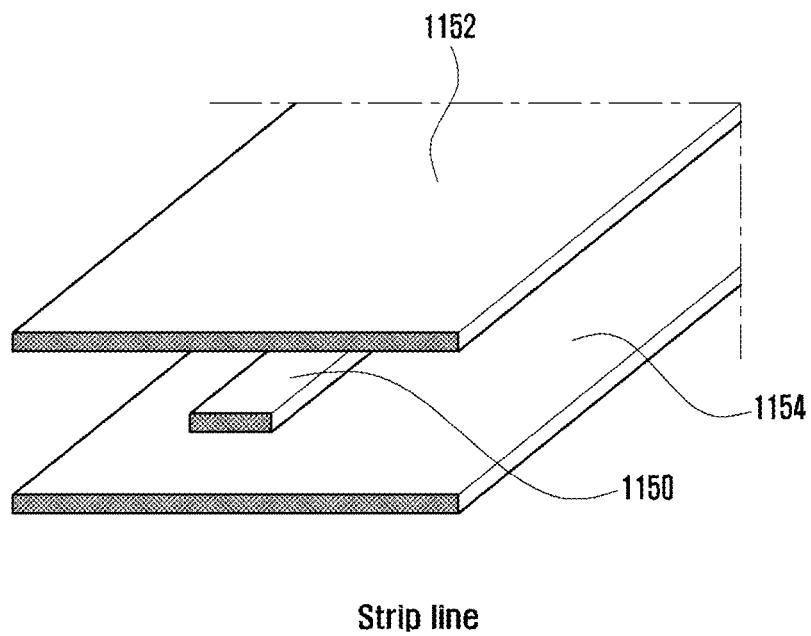
Figure 12C:
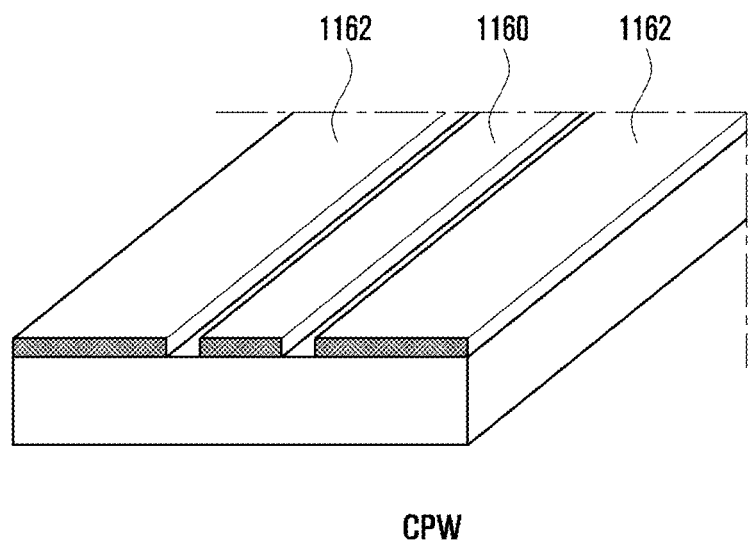

FIG. 11A to 11C are diagrams illustrating RF transmission lines according to various embodiments. FIGS. 12A to 12C are diagrams illustrating RF transmission lines according to various embodiments.

RF transmission lines 260 (e.g., the RF transmission lines 260 of FIGS. 6 and 7) of electronic devices (e.g., the electronic device 200 of FIGS. 6 and 7) according to various embodiments may be formed as various types of transmission line.

As an example, as shown in FIG. 11A, RF transmission lines (e.g., the RF transmission lines 260 of FIGS. 6 and 7) may be formed with a coaxial cable 1110.

As an example, as shown in FIG. 11B, RF transmission lines (e.g., the RF transmission lines 260 of FIGS. 6 and 7) may be formed with a rectangular waveguide 1120.

As an example, as shown in FIG. 11C, RF transmission lines (e.g., the RF transmission lines 260 of FIGS. 6 and 7) may be formed with a circular waveguide 1130.

As an example, as shown in FIG. 12A, micro strip line 1140 and RF transmission lines (e.g., the RF transmission lines 260 of FIGS. 6 and 7) may be formed with the ground line 1142. An insulating layer 1144 may be disposed between the micro strip line 1140 and the ground lines 1142.

As an example, ss shown in FIG. 12B, RF transmission lines (e.g., the RF transmission lines 260 of FIGS. 6 and 7) may be formed with a strip line 1150 and a plurality of ground lines 1152 and 1154. Strip lines 1150 may be disposed at regular intervals between the plurality of ground lines 1152 and 1154 in a vertical direction (e.g., a z-axis direction).

As an example, as shown in FIG. 12C, RF transmission lines (e.g., the RF transmission lines 260 of FIGS. 6 and 7) may be formed with a CPW. As an example, a strip line 1160 and a plurality of ground lines 1162 may be substantially disposed on the same plane to form RF transmission lines (e.g., RF transmission lines 260 of FIGS. 6 and 7). Strip lines 1160 may be disposed at regular intervals between a plurality of ground lines 1162 in the horizontal direction (e.g., the x-axis direction).

FIG. 13A to 13E are diagrams illustrating examples of RF transmission lines according to the number of radiating parts of an antenna.

RF transmission lines 260 (e.g., the RF transmission lines 260 of FIGS. 6 and 7) of electronic devices (e.g., the electronic device 200 of FIGS. 6 and 7) according to various embodiments may be formed as various types of transmission line.

Figure 13A:
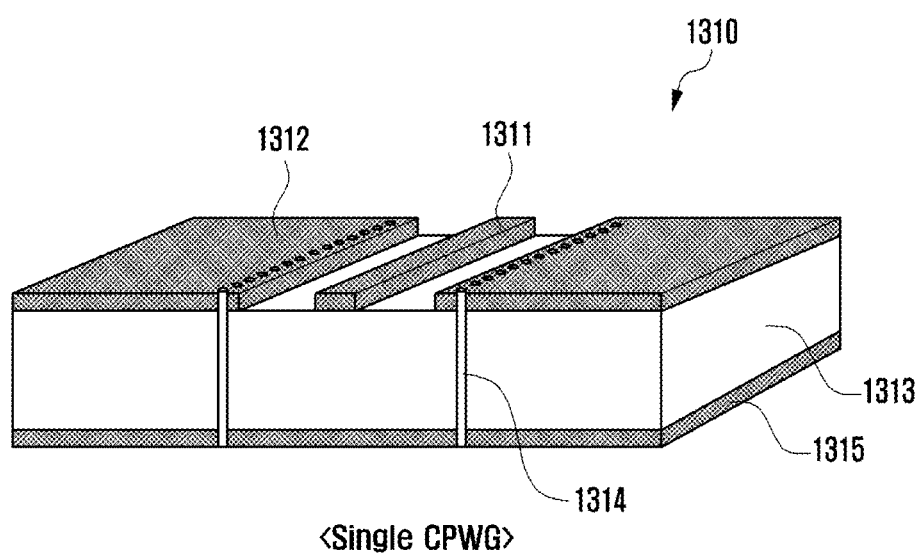
FIG. 13A to 13E are diagrams illustrating examples of RF transmission lines according to the number of radiating parts of an antenna.

As shown in FIG. 13A, RF transmission lines 1310 (e.g., the RF transmission lines 260 of FIGS. 6 and 7) may be formed in a single co-planar wave guide (CPWG) with a ground (GND) type. As an example, an RF signal line 1311 and ground lines 1312 may be disposed on (directly or indirectly) the insulating layer 1313. The RF signal lines 1311 may be disposed at regular intervals between the ground lines 1312. The ground lines 1312 may be electrically connected to the ground terminal 1315 through vias 1314 penetrating the insulating layer 1313.

Figure 13B:
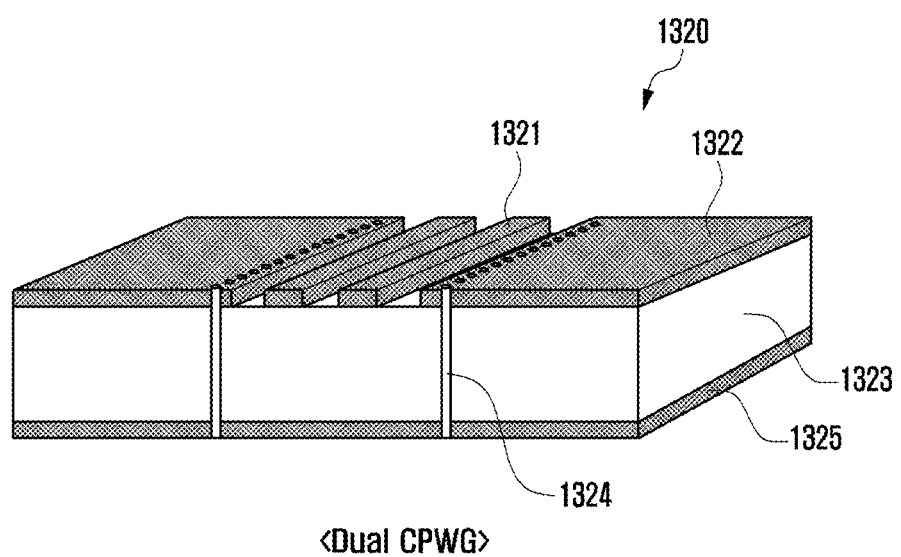

As shown in FIG. 13B, the RF transmission lines 1320 (e.g., the RF transmission lines 260 of FIGS. 6 and 7) may be formed in a dual CPWG type. As an example, RF signal lines 1321 and ground lines 1322 may be disposed on the insulating layer 1323. The RF signal lines 1321 may be disposed at regular intervals between the ground lines 1322. The ground lines 1322 may be electrically connected to the ground terminal 1325 through vias 1324 penetrating the insulating layer 1323. As an example, the number of RF signal lines 1321 may be determined according to the number of radiation units of the antenna (e.g., the antenna 230 of FIGS. 6 and 7). When two radiation units are disposed, two RF signal lines 1321 may be disposed, and when three radiation units are disposed, three RF signal lines 1321 may be disposed.

Figure 13C:
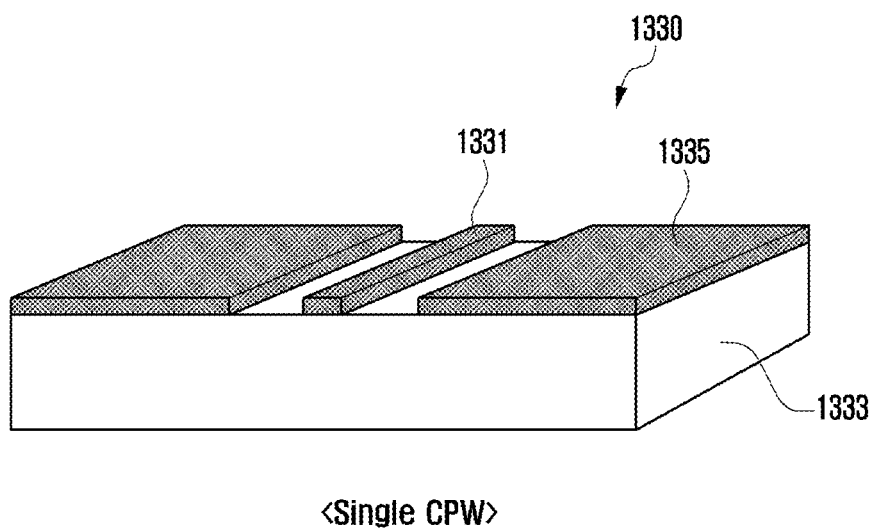

As shown in FIG. 13C, RF transmission lines 1330 (e.g., the RF transmission lines 260 of FIGS. 6 and 7) may be formed as a single CPW type. As an example, an RF signal line 1331 and ground lines 1335 may be disposed on the insulating layer 1333. The RF signal lines 1331 may be disposed at regular intervals between the ground lines 1335. The RF signal line 1331 and the ground lines 1335 may be substantially disposed on the same plane.

Figure 13D:
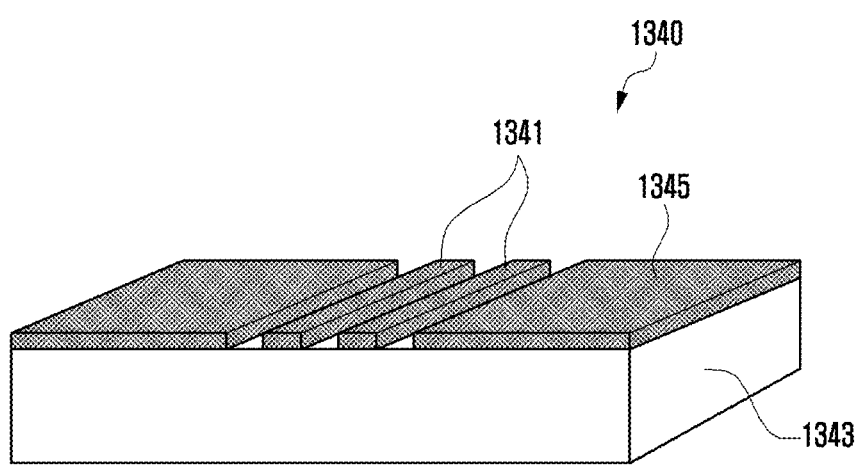

As shown in FIG. 13D, the RF transmission lines 1340 (e.g., the RF transmission lines 260 of FIGS. 6 and 7) may be formed in a dual CPW type. As an example, RF signal lines 1341 and ground lines 1345 may be disposed on the insulating layer 1343. The RF signal lines 1341 may be disposed at regular intervals between the ground lines 1345. The RF signal line 1341 and the ground lines 1345 may be substantially disposed on the same plane.

Figure 13E:
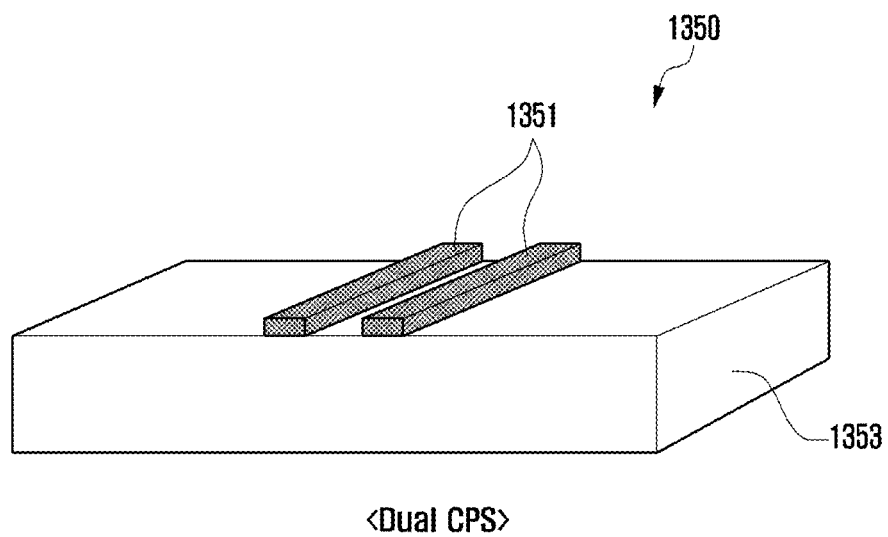

As shown in FIG. 13E, RF transmission lines 1350 (e.g., the RF transmission lines 260 of FIGS. 6 and 7) may be formed as a co-planar trip (CPS) type. As an example, RF signal lines 1351 may be disposed on the insulating layer 1353.

Figure 14A:
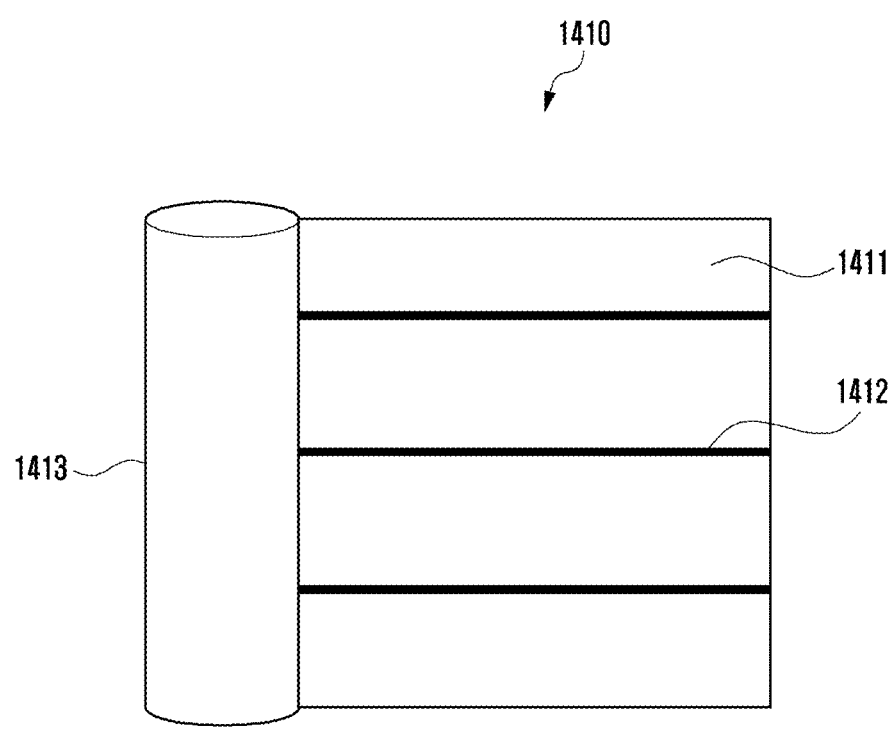
FIG. 14A is a diagram illustrating a form of an example RF transmission line when a display of an electronic device is in an expanded state.
Figure 14B:
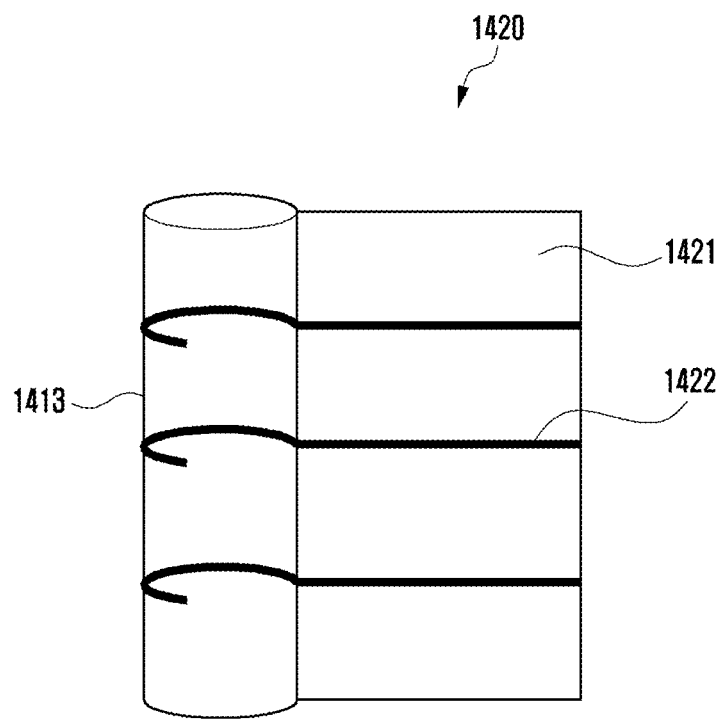
FIG. 14B is a diagram illustrating a form of an example RF transmission line when a display of an electronic device is partially rolled up.
Figure 14C:
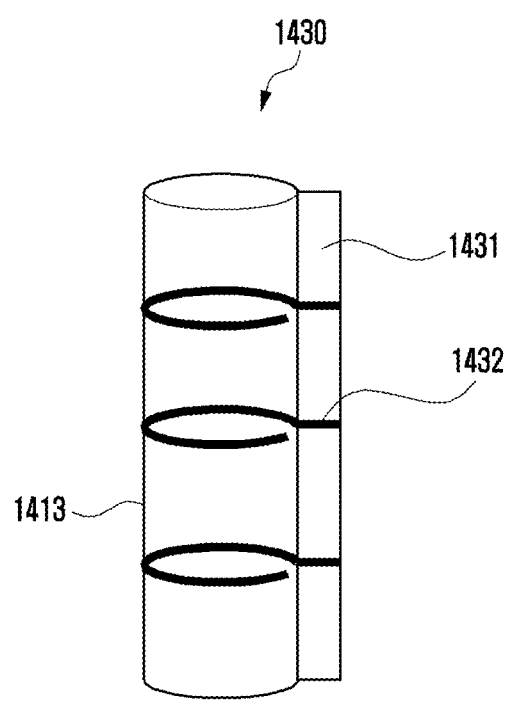
FIG. 14C is a diagram illustrating a form of an example RF transmission line when a display of an electronic device is completely rolled up.

FIG. 14A is a diagram 1410 illustrating a form of an RF transmission line when the display of the electronic device is in an expanded state. FIG. 14B is a diagram 1420 illustrating a form of an RF transmission line when a display of an electronic device is partially rolled up. FIG. 14C is a diagram 1430 illustrating a form of the RF transmission lines when the display of the electronic device is completely rolled up.

With reference to FIG. 14A, the display 1411 (e.g., the first display 220 of FIGS. 6 and 7) may be pulled out from housing 1413 and the display 1411 of the electronic device (e.g., the electronic device 200 of FIGS. 6 and 7) may be in an expanded state. In the case that the display 1411 of the electronic devices (e.g., the electronic device 200 of FIGS. 6 and 7) is in an expanded state 1410, the RF transmission lines 1412 (e.g., the RF transmission lines 260 of FIGS. 6 and 7) may be disposed by being laid out in a bar shape without overlapping.

With reference to FIG. 14B, a portion of the display 1421 (e.g., the first display 220 of FIGS. 6 and 7) may be pulled out from housing 1413 and a portion of the display 1421 may be pushed into, and the display 1421 of the electronic device (e.g., the electronic device 200 of FIGS. 6 and 7) may be in a partially rolled state 1420. In the case that the display 1421 of the electronic devices (e.g., the electronic device 200 of FIGS. 6 and 7) is in a partially rolled state 1420, a portion of the RF transmission lines 1422 (e.g., the RF transmission lines 260 of FIGS. 6 and 7) may be disposed in a rolled form.

With reference to FIG. 14C, all the display 1431 (e.g., the first display 220 of FIGS. 6 and 7) may be pushed into the inner space of the housing 1413, and the display 1431 of the electronic device (e.g., the electronic device 200 of FIGS. 6 and 7) may be in a contracted state. In the case that all the display 1431 of the electronic devices (e.g., the electronic device 200 of FIGS. 6 and 7) is in a rolled state 1430, the RF transmission lines 1432 (e.g., the RF transmission lines 260 of FIGS. 6 and 7) may be disposed in a rolled form.

Figure 15:
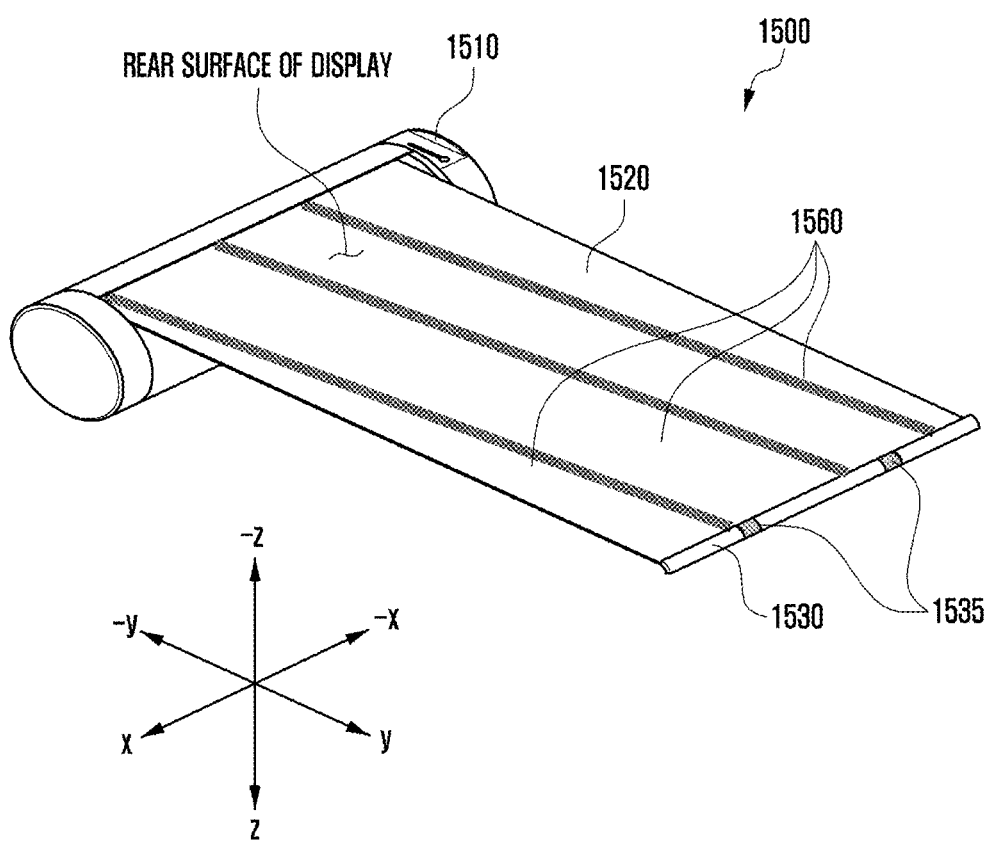
FIG. 15 is a diagram illustrating a disposition form of example RF transmission lines according to various embodiments.
Figure 16:
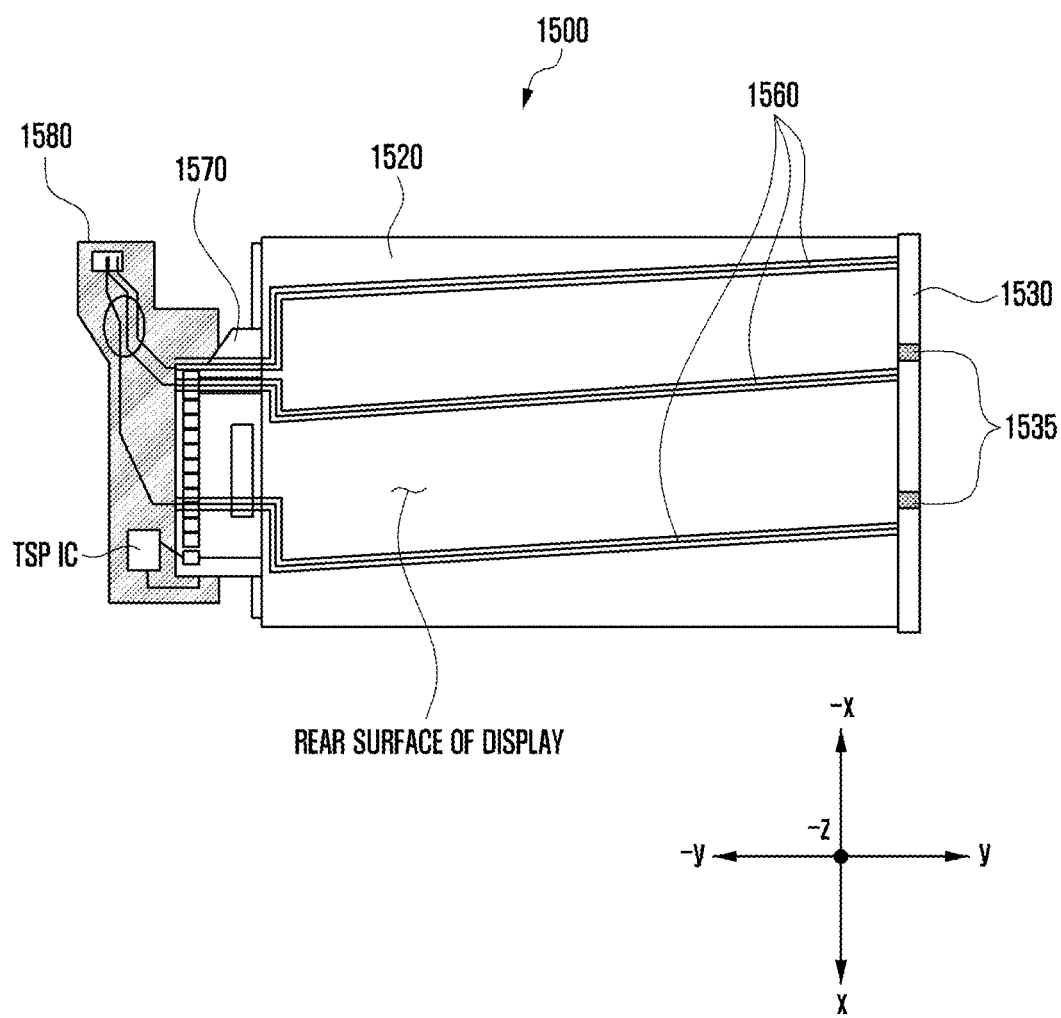
FIG. 16 is a diagram showing an example connection structure between RF transmission lines and an FPCB.

FIG. 15 is a diagram illustrating a disposition form of RF transmission lines according to various embodiments. FIG. 16 is a diagram showing a connection structure between RF transmission lines and an FPCB.

With reference to FIGS. 15 and 16, the main display 1520 may be pulled out from or pushed into the housing 1510. RF transmission lines 1560 may be disposed on (directly or indirectly) the rear surface of the main display 1520.

As an example, when the electronic device 1500 is in an expanded state, the RF transmission lines 1560 may be disposed in a form of traversing the rear surface of the active area (e.g., the area where the screen is displayed) of the main display 1520 in the first direction (e.g., the X-axis direction). As an example, in a contracted state (e.g., the state in which the main display 1520 is rolled up) of the electronic device 1500, the RF transmission lines 1560 may be disposed inclined in an oblique form (e.g., the oblique direction of xy on the xy plane) for the RF transmission lines 1560 not to overlap.

According to an embodiment, the first side of the RF transmission lines 1560 may be electrically connected to the plurality of antennas 1530, and the second side may be electrically connected to the COP unit 1570. The COP unit 1570 may be electrically connected to the FPCB 1580

As an example, the RF transmission lines 1560 and the plurality of antennas 1530 may be connected using an anisotropic conductive film (ACF) bonding method. A plurality of antennas 1530 may be segmented as an insulator 1535 is disposed between the plurality of antennas 1530.

According to an embodiment, the FPCB 1580 electrically connected to the RF transmission lines 1560 may be electrically connected to the main PCB of the electronic device 1500. According to an embodiment, a touch driver (e.g., the touch screen panel integrated circuits (TSP IC)) for driving a touch sensor (e.g., the touch sensor 914 of FIG. 9) may be disposed in the FPCB 1580.

According to an embodiment, an antenna module (e.g., the antenna module 197 of FIG. 1, comprising at least one antenna) may be disposed on (directly or indirectly) the main PCB and the plurality of antennas 1530 may be electrically connected to the antenna module via the conductive RF transmission lines 1560 and the FPCB 1580.

Figure 17:
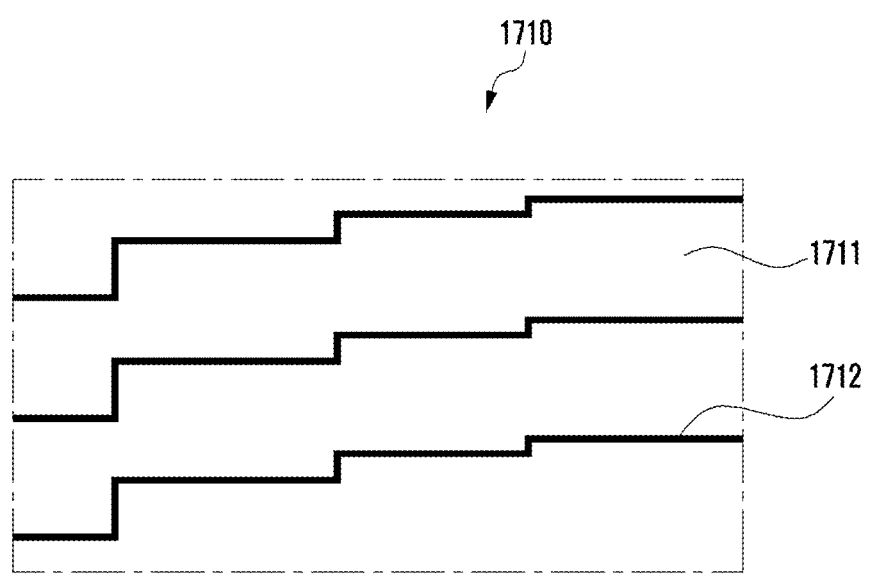
FIG. 17 is a diagram illustrating a disposition form of RF transmission lines according to various example embodiments.

FIG. 17 is a diagram illustrating a disposition form 1710 of RF transmission lines according to various embodiments.

With reference to FIG. 17, when the electronic device (e.g., the electronic device 1500 of FIG. 15) is in an expanded state, the RF transmission lines 1712 may be disposed in a form of traversing the rear surface of the active area (e.g., the area where the screen is displayed) of the main display 1711 in the first direction (e.g., the X-axis direction). As an example, in a contracted state (e.g., the state in which the main display 1711 is rolled up) of the electronic device, the RF transmission lines 1712 may be disposed in the form of a step inclined in an oblique form (e.g., the oblique direction of xy on the xy plane) for the RF transmission lines 1712 not to overlap.

Figure 18:
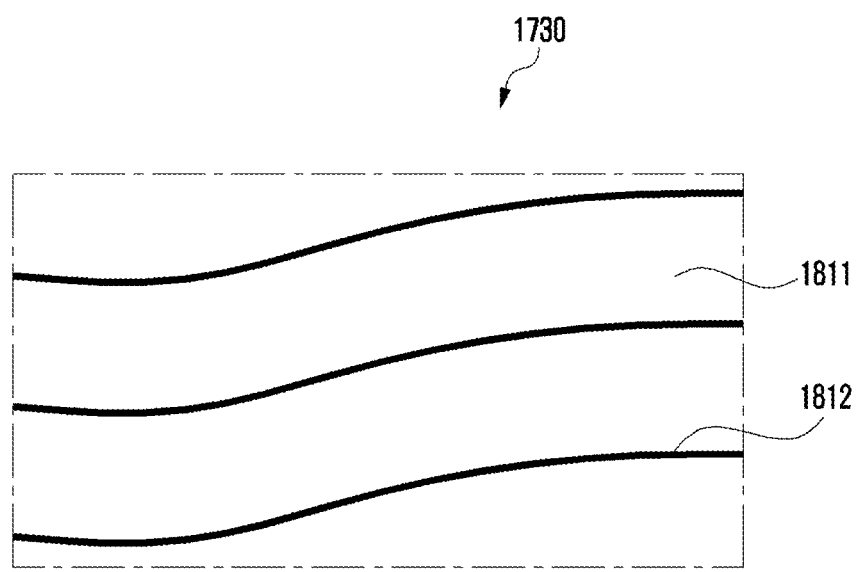
FIG. 18 is a diagram illustrating a disposition form of RF transmission lines according to various example embodiments.

FIG. 18 is a diagram illustrating a disposition form 1730 of RF transmission lines according to various embodiments.

When the electronic device (e.g., the electronic device 1500 of FIG. 15) is in an expanded state, the RF transmission lines 1812 may be disposed in a form of traversing the rear surface of the active area (e.g., the area where the screen is displayed) of the main display 1811 in the first direction (e.g., the X-axis direction). As an example, in a contracted state (e.g., the state in which the main display 1811 is rolled up) of the electronic device, the RF transmission lines 1812 may be disposed in a form of a curve inclined in an oblique form for the RF transmission lines 1812 not to overlap.

According to various embodiments, the RF transmission lines 1712 and 1812 may be disposed in the active area (e.g., the area where the screen is displayed, the front of the display) of the display 1711 and 1811 using the electrodes made of transparent materials such as indium tin oxide (ITO) and indium zinc oxide (IZO) as well as metal.

Figure 19A:
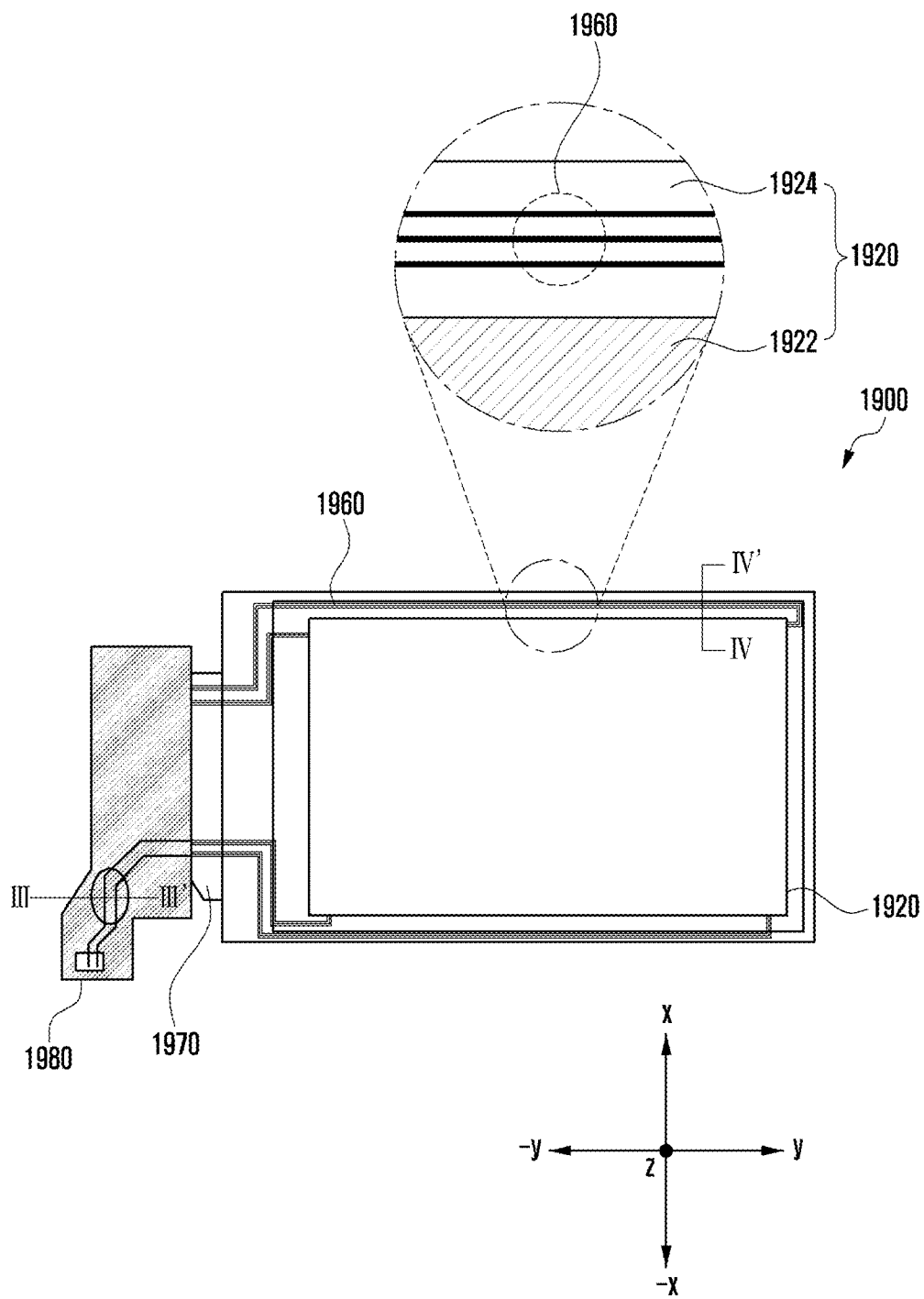
FIG. 19A is a diagram illustrating example RF transmission lines disposed on the front side of a display.
Figure 19B:
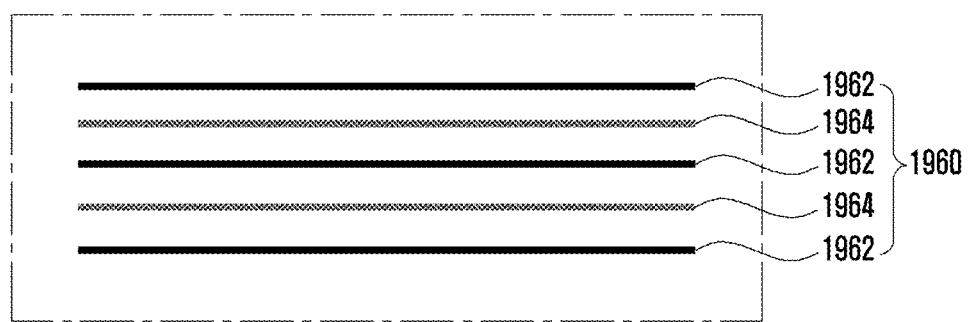
FIG. 19B is a diagram illustrating an example of a disposition of RF transmission lines.
Figure 20:
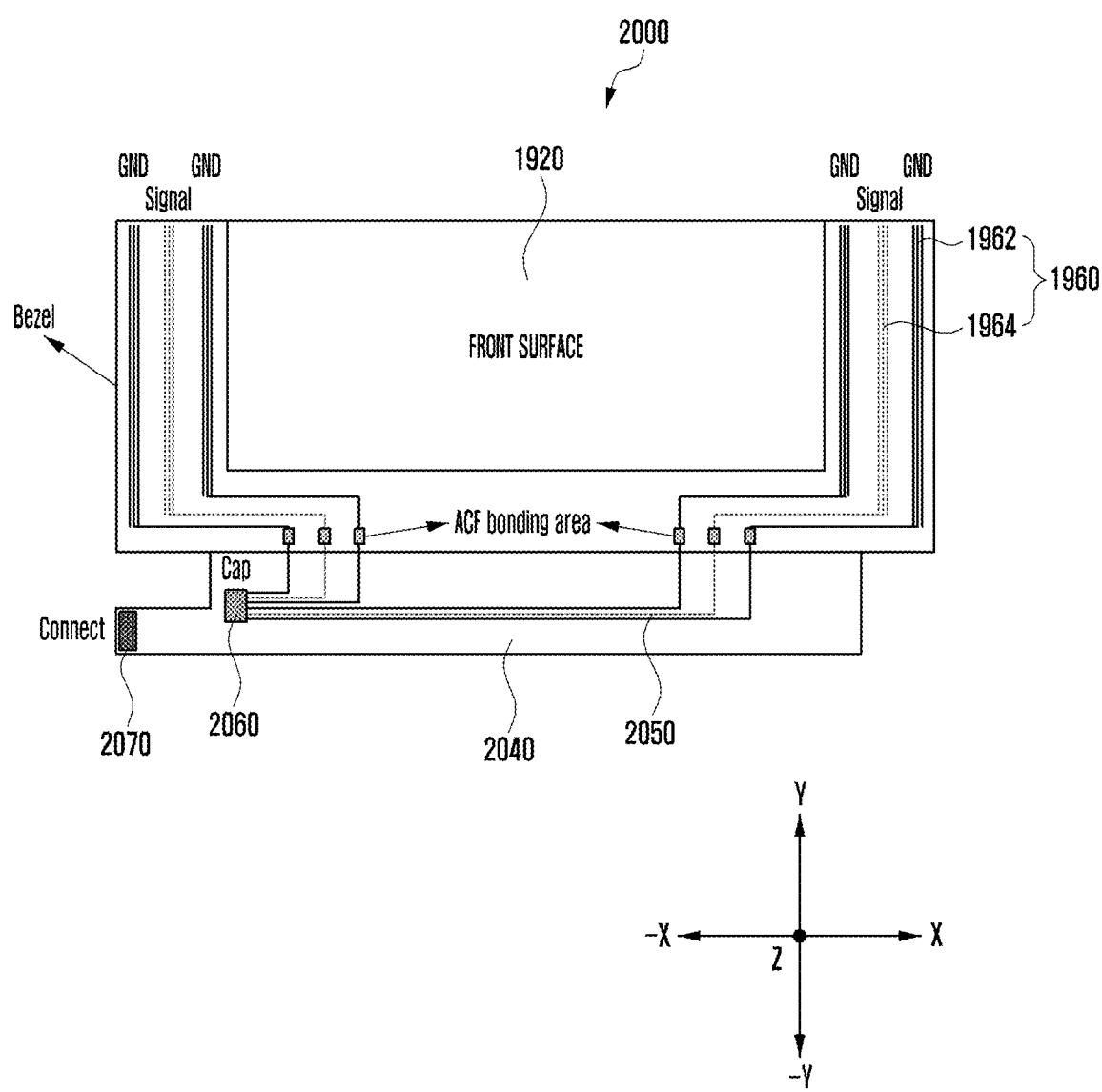
FIG. 20 is a diagram illustrating a disposition form of RF transmission lines according to various example embodiments.

FIG. 19A is a diagram illustrating RF transmission lines disposed on the front side of a display. FIG. 19B is a diagram illustrating an example of a disposition of RF transmission lines. FIG. 20 is a diagram illustrating a disposition form of RF transmission lines according to various embodiments.

With reference FIG. 19 to FIG. 20, the electronic device 1900 according to various embodiments may include a housing (e.g., the housing 210 of FIGS. 6 and 7), a first display 1920, a second display (e.g., the second display 250 of FIG. 2), RF transmission lines 1960, COP unit 1970, and FPCB 1980.

According to an embodiment, RF transmission lines 1960 may be disposed on the non-display area 1924 (e.g., the BM area) of the front surface (e.g., the surface where the screen is displayed) of the first/main display 1920, The RF transmission lines 1960 may not be displayed on the active area 1922 (e.g., the area where the screen is displayed) of the main display 1920.

According to an embodiment, RF transmission lines 1960 may be disposed corresponding to the number of the plurality of antennas (e.g., the plurality of antennas 230 of FIGS. 6 and 7).

According to an embodiment, the RF transmission lines 1960 may include the conductive ground lines 1962 (e.g., the ground line 1032 of FIG. 10) and the RF signal line 1964 (e.g., the RF signal line 1034 of FIG. 10). As an example, the ground line 1962 and the RF signal line 1964 may be alternately disposed.

According to an embodiment, as shown in FIG. 19B, the ground lines 1962 may be formed on the outermost part, and at least one RF signal line 1964 may be disposed between the ground lines 1962.

According to an embodiment, the ground lines 1962 may be disposed between a plurality of RF signal lines 1964.

According to an embodiment, the RF transmission lines 1960 may be formed by combining 50 ohm transmission lines (CPW or strip line). According to an embodiment, the RF transmission lines 1960 may be formed as one of the transmission lines described with reference to FIGS. 11A to 12C.

According to an embodiment, a 50 ohm transmission line may be formed by bonding a CPW or a strip line to the front of the main display 1920.

According to an embodiment, a 50 ohm transmission line may be formed by depositing a CPW or a strip line on the front surface of the main display 1920.

According to an embodiment, RF transmission lines 1960 may be formed as a structure of a flexible type CPW or a strip line on a separate FPCB, and the formed RF transmission lines 1960 may be coupled to the front surface of the first display 220. Here, a 50 ohm connection method may configure a line (Signal) and/or a ground (GND) according to the structure of a CPW or a strip line.

According to an embodiment, the first side of the RF transmission lines 1960 may be connected to the plurality of antennas (e.g., the plurality of antennas 230 of FIGS. 6 and 7), and the second side may be electrically connected to the COP unit 1970. The COP unit 1970 may be electrically connected to the FPCB 1980.

According to an embodiment, the FPCB 1980 electrically connected to the RF transmission lines 1960 may be electrically connected to the main PCB of the electronic devices 1900 and 2000.

According to an embodiment, the antenna module (e.g., the antenna module 197 of FIG. 1) may be disposed on the main PCB, and a plurality of antennas may be electrically connected to the antenna module via RF transmission lines 1960 and FPCB 1980.

The ground line 1962 and the RF signal line 1964 may be disposed in a form of traversing the non-display area 1924 of the main display 1920 in a second direction (e.g., the Y-axis direction) and be electrically connected to the FPCB 1980 via COP unit 1970 and 2040.

A plurality of contact lines 2050 (e.g., see FIG. 20) connected to the ground line 1962 and the RF signal line 1964 may be disposed in the COP units 1970 and 2040, and the plurality of contact lines 2050 may be connected to the contact unit 2060.

A plurality of lines connecting the contact unit 2060 and the connector 2070 may be disposed inside the COP units 1970 and 2040 and may be electrically connected to the FPCB 1980 through the connector 2070.

Figure 21:
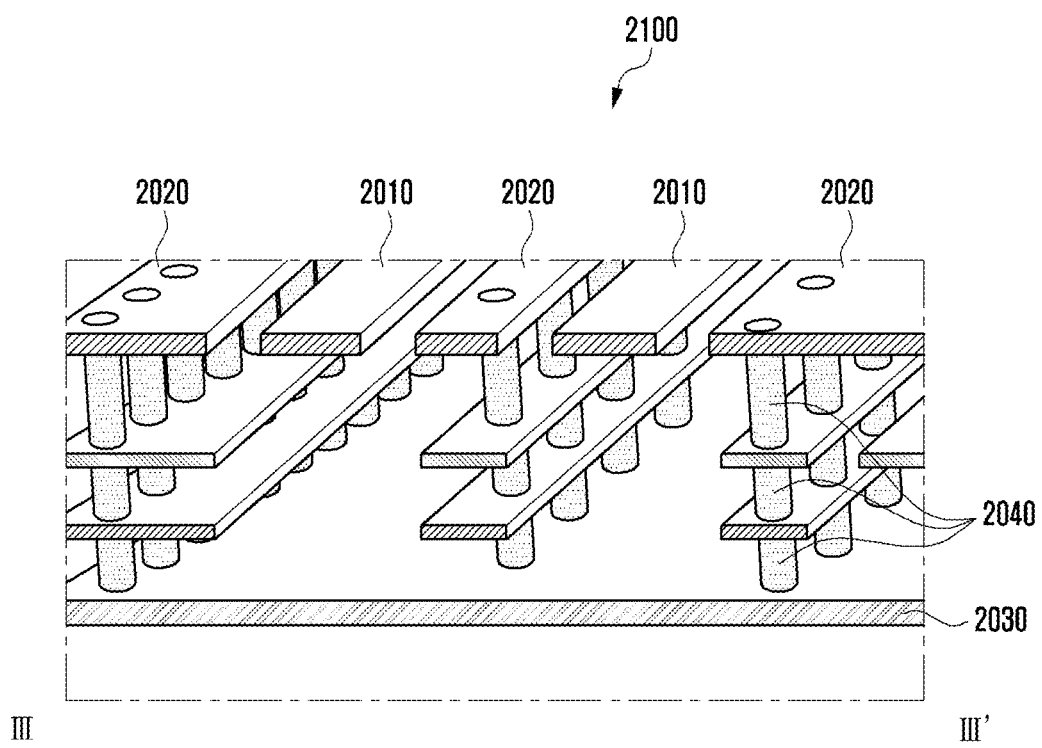
FIG. 21 is a cross-sectional view along the line shown in FIG. 19A.

FIG. 21 is a cross-sectional view along the line shown in FIG. 19A.

With reference to FIG. 21 at 2100, the ground line 2020 and the RF signal line 2010 may be substantially disposed on the same plane. The ground line 2020 may be electrically connected to the ground terminal 2030 through the via 2040.

An electronic device according to various example embodiments may include an RF component and/or an antenna in the rolling area of the electronic device by disposing the antenna at the end of the display and disposing an RF transmission line connecting the antenna and the FPCB on the rear surface of the display.

An electronic device according to various example embodiments may include an RF component and/or an antenna in the rolling area of the electronic device by disposing the antenna at the end of the display and disposing an RF transmission line connecting antenna and FPCB in a non-display area (e.g., a BM area) of the front surface of the display.

Figure 22:
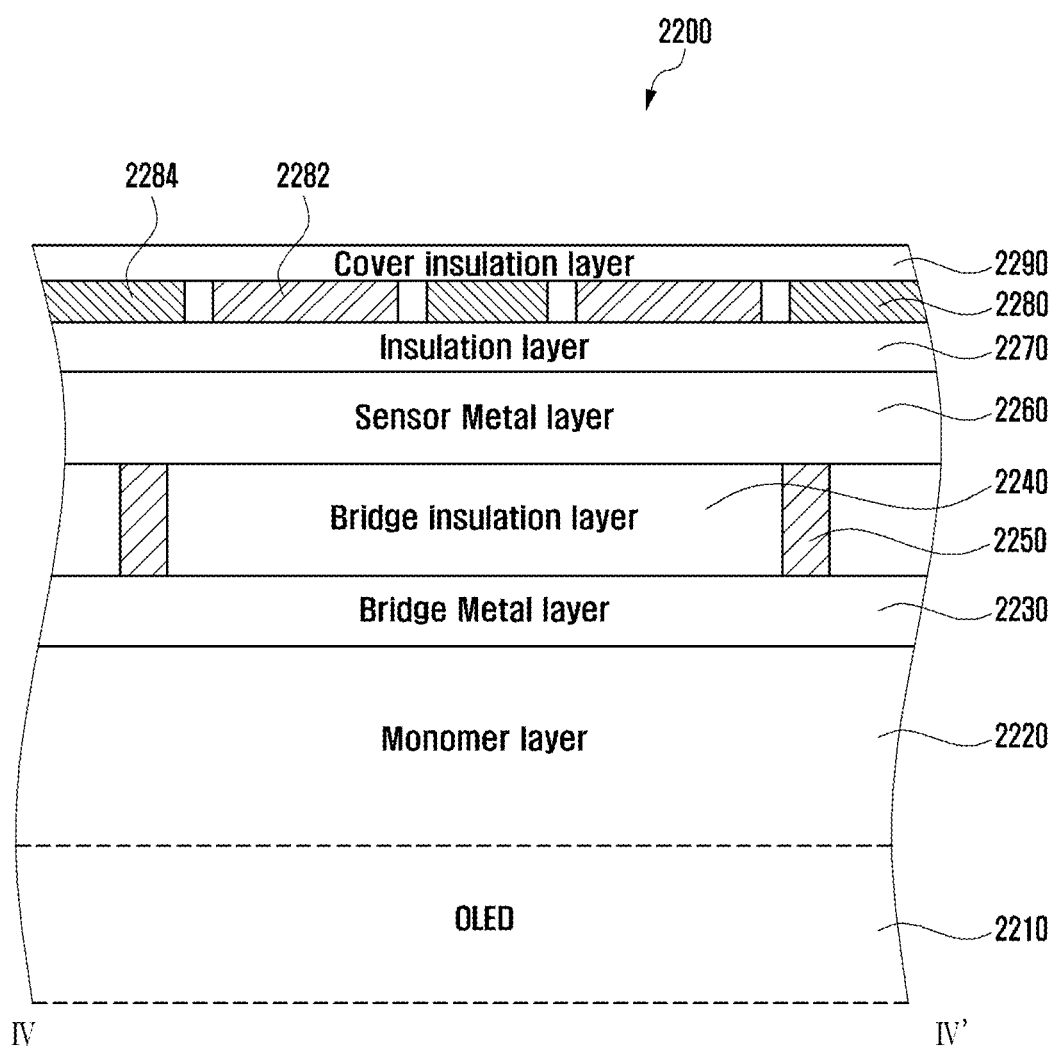
FIG. 22 is a cross-sectional view taken along line IV-IV' shown in FIG. 19A.

FIG. 22 is a cross-sectional view taken along line IV-IV' shown in FIG. 19A.

With reference to FIG. 22, a cross section of the non-display area (e.g., BM area) of the electronic device 2200 is shown. The electronic device 2200 may include a display 2210 (e.g., an OLED panel), a polymer layer 2220 (e.g., a monomer layer), a bridge metal layer 2230, a bridge insulation layer 2240, a via 2250, a sensor metal layer 2260, an insulation layer 2270, an RF signal line layer 2280 (e.g., metal line layer), and a cover insulating layer 2290. The RF signal line layer 2280 may include metal lines 2282 and ground lines 2284. The metal lines 2282 and the ground lines 2284 may be alternately disposed, and a metal line 2282 may be disposed between the ground lines 2284. The display 2210 (e.g., an OLED panel) may not be disposed in a portion of the non-display area (e.g., the BM area).

An electronic device according to various example embodiments may include an RF component and/or an antenna in the rolling area of the electronic device by disposing the antenna at the end of the display and disposing an RF transmission line connecting the antenna and the FPCB on (directly or indirectly) the rear surface of the display.

An electronic device according to various example embodiments may include an RF component and/or an antenna in the rolling area of the electronic device by disposing the antenna at the end of the display and disposing an RF transmission line connecting antenna and FPCB in a non-display area (e.g., a BM area) of the front surface of the display.

An electronic device (e.g., an electronic device 101 of FIG. 1, an electronic device 200 of FIG. 2, an electronic device 200 of FIGS. 6 and 7, an electronic device of FIGS. 15 and 16) 1500, an electronic device 1900 of FIG. 19A, the electronic device 2000 of FIG. 20, and an electronic device 2200 of FIG. 22) according to an example embodiment may include a body (e.g., the body 211 of FIGS. 2 to 5) having a cylindrical shape as a cylindrical housing (e.g., the cylindrical housing 210 of FIGS. 2 to 5). The main body (e.g., the body 211 of FIGS. 2 to 5) may include a first side surface portion extending from one end and a second side surface portion extending from the other end of the main body (e.g., the body 211 of FIGS. 2 to 5) and disposed in parallel with the first side surface portion. The main body (e.g., the body of 211 of FIGS. 2 to 5) may include a rollable display (e.g., the first display 220 of FIGS. 2 to 7, the display 910 of FIG. 9, the display 1010 of FIG. 10, the display 1411 of FIG. 14A, the display 1421 of FIG. 14B, the display 1431 of FIG. 14C, the display 1520 of FIG. 15, the main display 1711 of FIG. 17, the display 1811 of FIG. 18, the display 1920 of FIG. 19A and the display 2210 of FIG. 22) that is disposed to be rolled in an inner space of the cylindrical housing (e.g., the cylindrical housing 210 of FIGS. 2 to 5), and pulled from the inside of the housing 210 to the outside and pushed into the inside of the housing 210. An electronic device according to an example embodiment may include radio frequency (RF) transmission lines (e.g., the RF transmission lines 260 of FIGS. 6 and 7, the RF signal line 810 of FIG. 8, the RF signal line 1034 of FIG. 10, the RF signal line 1311 of FIG. 13A, the RF signal line 1321 of FIG. 13B, the RF signal line 1331 of FIG. 13C, the RF signal line 1964 of FIG. 19A, and the RF signal line 2010 of FIG. 21) disposed to traverse the active display area of the rollable display (e.g., the first display 220 of FIGS. 2 to 7, the display 910 of FIG. 9, the display 1010 of FIG. 10, the display 1411 of FIG. 14A, the display 1421 of FIG. 14B, the display 1431 of FIG. 14C, the display 1520 of FIG. 15, the main display 1711 of FIG. 17, the display 1811 of FIG. 18, the display 1920 of FIG. 19A and the display 2210 of FIG. 22) on the rear surface of the rollable display (e.g., the first display 220 of FIGS. 2 to 7, the display 910 of FIG. 9, the display 1010 of FIG. 10, the display 1411 of FIG. 14A, the display 1421 of FIG. 14B, the display 1431 of FIG. 14C, the display 1520 of FIG. 15, the main display 1711 of FIG. 17, the display 1811 of FIG. 18, the display 1920 of FIG. 19A and the display 2210 of FIG. 22). An electronic device (e.g., an electronic device 101 of FIG. 1, an electronic device 200 of FIG. 2, an electronic device 200 of FIGS. 6 and 7, an electronic device of FIGS. 15 and 16) 1500, an electronic device 1900 of FIG. 19A, electronic device 2000 of FIG. 20, and an electronic device 2200 of FIG. 22) according to an example embodiment may be disposed on one side of the rollable display (e.g., the first display 220 of FIGS. 2 to 7, the display 910 of FIG. 9, the display 1010 of FIG. 10, the display 1411 of FIG. 14A, the display 1421 of FIG. 14B, the display 1431 of FIG. 14C, the display 1520 of FIG. 15, the main display 1711 of FIG. 17, the display 1811 of FIG. 18, the display 1920 of FIG. 19A and the display 2210 of FIG. 22) and include a plurality of antennas electrically connected to the first side of the plurality of RF transmission lines (e.g., the RF transmission lines 260 of FIGS. 6 and 7, the RF signal line 810 of FIG. 8, the RF signal line 1034 of FIG. 10, the RF signal line 1311 of FIG. 13A, the RF signal line 1321 of FIG. 13B, the RF signal line 1331 of FIG. 13C, the RF signal line 1964 of FIG. 19A, and the RF signal line 2010 of FIG. 21). An electronic device (e.g., an electronic device 101 of FIG. 1, an electronic device 200 of FIG. 2, an electronic device 200 of FIGS. 6 and 7, an electronic device of FIGS. 15 and 16) 1500, an electronic device 1900 of FIG. 19A, the electronic device 2000 of FIG. 20, and an electronic device 2200 of FIG. 22) according to an example embodiment may include a flexible circuit board (e.g., the printed circuit board 280 of FIG. 6) electrically connected to a second side of the RF transmission lines (e.g., the RF transmission lines 260 of FIGS. 6 and 7, the RF signal line 810 of FIG. 8, the RF signal line 1034 of FIG. the RF signal line 1311 of FIG. 13A, the RF signal line 1321 of FIG. 13B, the RF signal line 1331 of FIG. 13C, the RF signal line 1964 of FIG. 19A, and the RF signal line 2010 of FIG. 21).

According to an embodiment, the RF transmission lines (e.g., the RF transmission lines 260 of FIGS. 6 and 7, the RF signal line 810 of FIG. 8, the RF signal line 1034 of FIG. 10, the RF signal line 1311 of FIG. 13A, the RF signal line 1321 of FIG. 13B, the RF signal line 1331 of FIG. 13C, the RF signal line 1964 of FIG. 19A, and the RF signal line 2010 of FIG. 21) may be disposed in a bar shape from one side to the other side of the rollable display (e.g., the first display 220 of FIGS. 2 to 7, the display 910 of FIG. 9, the display 1010 of FIG. 10, the display 1411 of FIG. 14A, the display 1421 of FIG. 14B, the display 1431 of FIG. 14C, the display 1520 of FIG. 15, the main display 1711 of FIG. 17, the display 1811 of FIG. 18, the display 1920 of FIG. 19A and the display 2210 of FIG. 22) on (directly or indirectly) the rear surface of the rollable display (e.g., the first display 220 of FIGS. 2 to 7, the display 910 of FIG. 9, the display 1010 of FIG. 10, the display 1411 of FIG. 14A, the display 1421 of FIG. 14B, the display 1431 of FIG. 14C, the display 1520 of FIG. 15, the main display 1711 of FIG. 17, the display 1811 of FIG. 18, the display 1920 of FIG. 19A and the display 2210 of FIG. 22).

According to an embodiment, the RF transmission lines (e.g., the RF transmission lines 260 of FIGS. 6 and 7, the RF signal line 810 of FIG. 8, the RF signal line 1034 of FIG. 10, the RF signal line 1311 of FIG. 13A, the RF signal line 1321 of FIG. 13B, the RF signal line 1331 of FIG. 13C, the RF signal line 1964 of FIG. 19A, and the RF signal line 2010 of FIG. 21) may be disposed not to overlap when the rollable display (e.g., the first display 220 of FIGS. 2 to 7, the display 910 of FIG. 9, the display 1010 of FIG. 10, the display 1411 of FIG. 14A, the display 1421 of FIG. 14B, the display 1431 of FIG. 14C, the display 1520 of FIG. 15, the main display 1711 of FIG. 17, the display 1811 of FIG. 18, the display 1920 of FIG. 19A and the display 2210 of FIG. 22) is in a state of being pushed into the inside of the housing (e.g., the cylindrical housing 210 of FIGS. 2 to 5).

According to an embodiment, the RF transmission lines (e.g., the RF transmission lines 260 of FIGS. 6 and 7, the RF signal line 810 of FIG. 8, the RF signal line 1034 of FIG. 10, the RF signal line 1311 of FIG. 13A, the RF signal line 1321 of FIG. 13B, the RF signal line 1331 of FIG. 13C, the RF signal line 1964 of FIG. 19A, and the RF signal line 2010 of FIG. 21) may be disposed in the form of a straight line inclined in an oblique form on the rear surface of the rollable display (e.g., the first display 220 of FIGS. 2 to 7, the display 910 of FIG. 9, the display 1010 of FIG. 10, the display 1411 of FIG. 14A, the display 1421 of FIG. 14B, the display 1431 of FIG. 14C, the display 1520 of FIG. 15, the main display 1711 of FIG. 17, the display 1811 of FIG. 18, the display 1920 of FIG. 19A and the display 2210 of FIG. 22).

According to an embodiment, the RF transmission lines (e.g., the RF transmission lines 260 of FIGS. 6 and 7, the RF signal line 810 of FIG. 8, the RF signal line 1034 of FIG. 10, the RF signal line 1311 of FIG. 13A, the RF signal line 1321 of FIG. 13B, the RF signal line 1331 of FIG. 13C, the RF signal line 1964 of FIG. 19A, and the RF signal line 2010 of FIG. 21) may be disposed in the form of a step inclined in an oblique form on the rear surface of the rollable display (e.g., the first display 220 of FIGS. 2 to 7, the display 910 of FIG. 9, the display 1010 of FIG. 10, the display 1411 of FIG. 14A, the display 1421 of FIG. 14B, the display 1431 of FIG. 14C, the display 1520 of FIG. 15, the main display 1711 of FIG. 17, the display 1811 of FIG. 18, the display 1920 of FIG. 19A and the display 2210 of FIG. 22).

According to an embodiment, the RF transmission lines (e.g., the RF transmission lines 260 of FIGS. 6 and 7, the RF signal line 810 of FIG. 8, the RF signal line 1034 of FIG. 10, the RF signal line 1311 of FIG. 13A, the RF signal line 1321 of FIG. 13B, the RF signal line 1331 of FIG. 13C, the RF signal line 1964 of FIG. 19A, and the RF signal line 2010 of FIG. 21) may be the electronic device (e.g., an electronic device 101 of FIG. 1, an electronic device 200 of FIG. 2, an electronic device 200 of FIGS. 6 and 7, an electronic device of FIGS. 15 and 16) 1500, an electronic device 1900 of FIG. 19A, the electronic device 2000 of FIG. 20, and an electronic device 2200 of FIG. 22) disposed in the form of a curve inclined in an oblique form on the rear surface of the rollable display (e.g., the first display 220 of FIGS. 2 to 7, the display 910 of FIG. 9, the display 1010 of FIG. 10, the display 1411 of FIG. 14A, the display 1421 of FIG. 14B, the display 1431 of FIG. 14C, the display 1520 of FIG. 15, the main display 1711 of FIG. 17, the display 1811 of FIG. 18, the display 1920 of FIG. 19A and the display 2210 of FIG. 22).

According to an embodiment, a COP (chip on panel) may be further included between the flexible display (e.g., the first display 220 of FIGS. 2 to 7, the display 910 of FIG. 9, the display 1010 of FIG. 10, the display 1411 of FIG. 14A, the display 1421 of FIG. 14B, the display 1431 of FIG. 14C, the display 1520 of FIG. 15, the main display 1711 of FIG. 17, the display 1811 of FIG. 18, the display 1920 of FIG. 19A and the display 2210 of FIG. 22) and the 14A14B14C19A FPCB 280, and the RF transmission lines (e.g., the RF transmission lines 260 of FIGS. 6 and 7, the RF signal line 810 of FIG. 8, the RF signal line 1034 of FIG. 10, the RF signal line 1311 of FIG. 13A, the RF signal line 1321 of FIG. 13B, the RF signal line 1331 of FIG. 13C, the RF signal line 1964 of FIG. 19A, and the RF signal line 2010 of FIG. 21) may be disposed on the COP.

According to an embodiment, the RF transmission lines (e.g., the RF transmission lines 260 of FIGS. 6 and 7, the RF signal line 810 of FIG. 8, the RF signal line 1034 of FIG. 10, the RF signal line 1311 of FIG. 13A, the RF signal line 1321 of FIG. 13B, the RF signal line 1331 of FIG. 13C, the RF signal line 1964 of FIG. 19A, and the RF signal line 2010 of FIG. 21) may be transitioned in a direction perpendicular to the rolling axis of the rollable display (e.g., the first display 220 of FIGS. 2 to 7, the display 910 of FIG. 9, the display 1010 of FIG. 10, the display 1411 of FIG. 14A, the display 1421 of FIG. 14B, the display 1431 of FIG. 14C, the display 1520 of FIG. 15, the main display 1711 of FIG. 17, the display 1811 of FIG. 18, the display 1920 of FIG. 19A and the display 2210 of FIG. 22).

According to an embodiment, the RF transmission lines (e.g., the RF transmission lines 260 of FIGS. 6 and 7, the RF signal line 810 of FIG. 8, the RF signal line 1034 of FIG. 10, the RF signal line 1311 of FIG. 13A, the RF signal line 1321 of FIG. 13B, the RF signal line 1331 of FIG. 13C, the RF signal line 1964 of FIG. 19A, and the RF signal line 2010 of FIG. 21) may include a coaxial cable (e.g., the coaxial cable 1110 of FIG. 11A).

According to an embodiment, the RF transmission lines (e.g., the RF transmission lines 260 of FIGS. 6 and 7, the RF signal line 810 of FIG. 8, the RF signal line 1034 of FIG. 10, the RF signal line 1311 of FIG. 13A, the RF signal line 1321 of FIG. 13B, the RF signal line 1331 of FIG. 13C, the RF signal line 1964 of FIG. 19A, and the RF signal line 2010 of FIG. 21) may include a rectangular waveguide (e.g., the rectangular waveguide 1120 of FIG. 11B).

According to an embodiment, the RF transmission lines (e.g., the RF transmission lines 260 of FIGS. 6 and 7, the RF signal line 810 of FIG. 8, the RF signal line 1034 of FIG. 10, the RF signal line 1311 of FIG. 13A, the RF signal line 1321 of FIG. 13B, the RF signal line 1331 of FIG. 13C, the RF signal line 1964 of FIG. 19A, and the RF signal line 2010 of FIG. 21) may include a circular waveguide (e.g., the circular waveguide 1130 of FIG. 11C).

According to an embodiment, the RF transmission lines (e.g., the RF transmission lines 260 of FIGS. 6 and 7, the RF signal line 810 of FIG. 8, the RF signal line 1034 of FIG. 10, the RF signal line 1311 of FIG. 13A, the RF signal line 1321 of FIG. 13B, the RF signal line 1331 of FIG. 13C, the RF signal line 1964 of FIG. 19A, and the RF signal line 2010 of FIG. 21) may include a micro strip line (e.g., a micro strip line 1140 of FIG. 12A) and a ground line disposed with an insulating layer interposed therebetween in a vertical direction.

According to an embodiment, the RF transmission lines (e.g., the RF transmission lines 260 of FIGS. 6 and 7, the RF signal line 810 of FIG. 8, the RF signal line 1034 of FIG. 10, the RF signal line 1311 of FIG. 13A, the RF signal line 1321 of FIG. 13B, the RF signal line 1331 of FIG. 13C, the RF signal line 1964 of FIG. 19A, and the RF signal line 2010 of FIG. 21) may include a plurality of ground lines and a strip line (e.g., a micro strip line 1140 of FIG. 12A) disposed between the plurality of ground lines in a vertical direction.

According to an embodiment, the RF transmission lines (e.g., the RF transmission lines 260 of FIGS. 6 and 7, the RF signal line 810 of FIG. 8, the RF signal line 1034 of FIG. 10, the RF signal line 1311 of FIG. 13A, the RF signal line 1321 of FIG. 13B, the RF signal line 1331 of FIG. 13C, the RF signal line 1964 of FIG. 19A, and the RF signal line 2010 of FIG. 21) may include the Co-Planar Wave (CPW) guide.

An electronic device (e.g., an electronic device 101 of FIG. 1, an electronic device 200 of FIG. 2, an electronic device 200 of FIGS. 6 and 7, an electronic device of FIGS. 15 and 16) 1500, an electronic device 1900 of FIG. 19A, the electronic device 2000 of FIG. 20, and an electronic device 2200 of FIG. 22) according to an example embodiment may include a body (e.g., the body 211 of FIGS. 2 to 5) having a cylindrical shape as a cylindrical housing (e.g., the cylindrical housing 210 of FIGS. 2 to 5). The main body (e.g., the body 211 of FIGS. 2 to 5) may include a first side surface portion extending from one end and a second side surface portion extending from the other end of the main body (e.g., the body 211 of FIGS. 2 to 5) and disposed in parallel with the first side surface portion, and the main body (e.g., the body of 211 of FIGS. 2 to 5) may include a rollable display (e.g., the first display 220 of FIGS. 2 to 7, the display 910 of FIG. 9, the display 1010 of FIG. 10, the display 1411 of FIG. 14A, the display 1421 of FIG. 14B, the display 1431 of FIG. 14C, the display 1520 of FIG. 15, the main display 1711 of FIG. 17, the display 1811 of FIG. 18, the display 1920 of FIG. 19A and the display 2210 of FIG. 22) that is disposed to be rolled in an inner space of the cylindrical housing (e.g., the cylindrical housing 210 of FIGS. 2 to 5), and pulled from the inside of the housing 210 to the outside and pushed into the inside of the housing 210. An electronic device according to an example embodiment may include radio frequency (RF) transmission lines disposed in the non-display area of the rollable display (e.g., the first display 220 of FIGS. 2 to 7, the display 910 of FIG. 9, the display 1010 of FIG. 10, the display 1411 of FIG. 14A, the display 1421 of FIG. 14B, the display 1431 of FIG. 14C, the display 1520 of FIG. 15, the main display 1711 of FIG. 17, the display 1811 of FIG. 18, the display 1920 of FIG. 19A and the display 2210 of FIG. 22) on the front surface of the rollable display (e.g., the first display 220 of FIGS. 2 to 7, the display 910 of FIG. 9, the display 1010 of FIG. 10, the display 1411 of FIG. 14A, the display 1421 of FIG. 14B, the display 1431 of FIG. 14C, the display 1520 of FIG. 15, the main display 1711 of FIG. 17, the display 1811 of FIG. 18, the display 1920 of FIG. 19A and the display 2210 of FIG. 22). An electronic device (e.g., an electronic device 101 of FIG. 1, an electronic device 200 of FIG. 2, an electronic device 200 of FIGS. 6 and 7, an electronic device of FIGS. 15 and 16) 1500, an electronic device 1900 of FIG. 19A, the electronic device 2000 of FIG. 20, and an electronic device 2200 of FIG. 22) according to an example embodiment may be disposed on one side of the rollable display (e.g., the first display 220 of FIGS. 2 to 7, the display 910 of FIG. 9, the display 1010 of FIG. 10, the display 1411 of FIG. 14A, the display 1421 of FIG. 14B, the display 1431 of FIG. 14C, the display 1520 of FIG. 15, the main display 1711 of FIG. 17, the display 1811 of FIG. 18, the display 1920 of FIG. 19A and the display 2210 of FIG. 22) and include a plurality of antennas electrically connected to the first side of the plurality of RF transmission lines (e.g., the RF transmission lines 260 of FIGS. 6 and 7, the RF signal line 810 of FIG. 8, the RF signal line 1034 of FIG. 10, the RF signal line 1311 of FIG. 13A, the RF signal line 1321 of FIG. 13B, the RF signal line 1331 of FIG. 13C, the RF signal line 1964 of FIG. 19A, and the RF signal line 2010 of FIG. 21). An electronic device (e.g., an electronic device 101 of FIG. 1, an electronic device 200 of FIG. 2, an electronic device 200 of FIGS. 6 and 7, an electronic device of FIGS. 15 and 16) 1500, an electronic device 1900 of FIG. 19A, the electronic device 2000 of FIG. 20, and an electronic device 2200 of FIG. 22) according to an example embodiment may include a flexible circuit board (e.g., the printed circuit board 280 of FIG. 6) electrically connected to a second side of the RF transmission lines (e.g., the RF transmission lines 260 of FIGS. 6 and 7, the RF signal line 810 of FIG. 8, the RF signal line 1034 of FIG. the RF signal line 1311 of FIG. 13A, the RF signal line 1321 of FIG. 13B, the RF signal line 1331 of FIG. 13C, the RF signal line 1964 of FIG. 19A, and the RF signal line 2010 of FIG. 21).

According to an embodiment, the RF transmission lines (e.g., the RF transmission lines 260 of FIGS. 6 and 7, the RF signal line 810 of FIG. 8, the RF signal line 1034 of FIG. 10, the RF signal line 1311 of FIG. 13A, the RF signal line 1321 of FIG. 13B, the RF signal line 1331 of FIG. 13C, the RF signal line 1964 of FIG. 19A, and the RF signal line 2010 of FIG. 21) may be disposed in a bar shape from one side to the other side of the rollable display (e.g., the first display 220 of FIGS. 2 to 7, the display 910 of FIG. 9, the display 1010 of FIG. 10, the display 1411 of FIG. 14A, the display 1421 of FIG. 14B, the display 1431 of FIG. 14C, the display 1520 of FIG. 15, the main display 1711 of FIG. 17, the display 1811 of FIG. 18, the display 1920 of FIG. 19A and the display 2210 of FIG. 22) on the front surface of the rollable display (e.g., the first display 220 of FIGS. 2 to 7, the display 910 of FIG. 9, the display 1010 of FIG. 10, the display 1411 of FIG. 14A, the display 1421 of FIG. 14B, the display 1431 of FIG. 14C, the display 1520 of FIG. 15, the main display 1711 of FIG. 17, the display 1811 of FIG. 18, the display 1920 of FIG. 19A and the display 2210 of FIG. 22).

According to an embodiment, the RF transmission lines (e.g., the RF transmission lines 260 of FIGS. 6 and 7, the RF signal line 810 of FIG. 8, the RF signal line 1034 of FIG. 10, the RF signal line 1311 of FIG. 13A, the RF signal line 1321 of FIG. 13B, the RF signal line 1331 of FIG. 13C, the RF signal line 1964 of FIG. 19A, and the RF signal line 2010 of FIG. 21) may be disposed not to overlap when the rollable display (e.g., the first display 220 of FIGS. 2 to 7, the display 910 of FIG. 9, the display 1010 of FIG. 10, the display 1411 of FIG. 14A, the display 1421 of FIG. 14B, the display 1431 of FIG. 14C, the display 1520 of FIG. 15, the main display 1711 of FIG. 17, the display 1811 of FIG. 18, the display 1920 of FIG. 19A and the display 2210 of FIG. 22) is in a state of being pushed into the inside of the housing (e.g., the cylindrical housing 210 of FIGS. 2 to 5).

According to an embodiment, a COP (chip on panel) may be further included between at least the flexible display (e.g., the first display 220 of FIGS. 2 to 7, the display 910 of FIG. 9, the display 1010 of FIG. 10, the display 1411 of FIG. 14A, the display 1421 of FIG. 14B, the display 1431 of FIG. 14C, the display 1520 of FIG. 15, the main display 1711 of FIG. 17, the display 1811 of FIG. 18, the display 1920 of FIG. 19A and the display 2210 of FIG. 22) and the 14A14B14C19AFPCB 280, and the RF transmission lines (e.g., the RF transmission lines 260 of FIGS. 6 and 7, the RF signal line 810 of FIG. 8, the RF signal line 1034 of FIG. 10, the RF signal line 1311 of FIG. 13A, the RF signal line 1321 of FIG. 13B, the RF signal line 1331 of FIG. 13C, the RF signal line 1964 of FIG. 19A, and the RF signal line 2010 of FIG. 21) may be disposed on the COP.

According to an embodiment, the RF transmission lines (e.g., the RF transmission lines 260 of FIGS. 6 and 7, the RF signal line 810 of FIG. 8, the RF signal line 1034 of FIG. 10, the RF signal line 1311 of FIG. 13A, the RF signal line 1321 of FIG. 13B, the RF signal line 1331 of FIG. 13C, the RF signal line 1964 of FIG. 19A, and the RF signal line 2010 of FIG. 21) may include a coaxial cable (e.g., the coaxial cable 1110 of FIG. 11A).

According to an embodiment, the RF transmission lines (e.g., the RF transmission lines 260 of FIGS. 6 and 7, the RF signal line 810 of FIG. 8, the RF signal line 1034 of FIG. 10, the RF signal line 1311 of FIG. 13A, the RF signal line 1321 of FIG. 13B, the RF signal line 1331 of FIG. 13C, the RF signal line 1964 of FIG. 19A, and the RF signal line 2010 of FIG. 21) may include a rectangular waveguide (e.g., the rectangular waveguide 1120 of FIG. 11B).

According to an embodiment, the RF transmission lines (e.g., the RF transmission lines 260 of FIGS. 6 and 7, the RF signal line 810 of FIG. 8, the RF signal line 1034 of FIG. 10, the RF signal line 1311 of FIG. 13A, the RF signal line 1321 of FIG. 13B, the RF signal line 1331 of FIG. 13C, the RF signal line 1964 of FIG. 19A, and the RF signal line 2010 of FIG. 21) may include a circular waveguide (e.g., the circular waveguide 1130 of FIG. 11C).

According to an embodiment, the RF transmission lines (e.g., the RF transmission lines 260 of FIGS. 6 and 7, the RF signal line 810 of FIG. 8, the RF signal line 1034 of FIG. 10, the RF signal line 1311 of FIG. 13A, the RF signal line 1321 of FIG. 13B, the RF signal line 1331 of FIG. 13C, the RF signal line 1964 of FIG. 19A, and the RF signal line 2010 of FIG. 21) may include a micro strip line (e.g., a micro strip line 1140 of FIG. 12A) and a ground line disposed with an insulating layer interposed therebetween in a vertical direction.

According to an embodiment, the RF transmission lines (e.g., the RF transmission lines 260 of FIGS. 6 and 7, the RF signal line 810 of FIG. 8, the RF signal line 1034 of FIG. 10, the RF signal line 1311 of FIG. 13A, the RF signal line 1321 of FIG. 13B, the RF signal line 1331 of FIG. 13C, the RF signal line 1964 of FIG. 19A, and the RF signal line 2010 of FIG. 21) may include a plurality of ground lines and a strip line (e.g., a micro strip line 1140 of FIG. 12A) disposed between the plurality of ground lines in a vertical direction.

According to an embodiment, the RF transmission lines (e.g., the RF transmission lines 260 of FIGS. 6 and 7, the RF signal line 810 of FIG. 8, the RF signal line 1034 of FIG. 10, the RF signal line 1311 of FIG. 13A, the RF signal line 1321 of FIG. 13B, the RF signal line 1331 of FIG. 13C, the RF signal line 1964 of FIG. 19A, and the RF signal line 2010 of FIG. 21) may include the Co-Planar Wave (CPW) guide.

While the disclosure has been illustrated and described with reference to various embodiments, it will be understood that the various embodiments are intended to be illustrative, not limiting. It will further be understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

The invention claimed is:

1. An electronic device comprising: a cylindrical housing comprising a housing body comprising a cylindrical shape, wherein the body comprises a first side surface portion extending from one end and a second side surface portion extending from another end of the body and disposed in parallel with the first side surface portion; a rollable display configured to be rolled in an inner space of the cylindrical housing, and to be moved and/or pulled from inside of the housing to at least partially outside of the housing, and to be moved and/or pushed into the inside of the housing; radio frequency (RF) transmission lines disposed to traverse an active area of the rollable display on a rear surface of the rollable display; a plurality of antennas disposed on one side of the rollable display and electrically connected to a first side of the plurality of RF transmission lines; and a flexible circuit board electrically connected to a second side of the RF transmission lines.

2. The electronic device of claim 1, wherein the RF transmission lines are disposed in a bar shape from one side to the other side of the rollable display on the rear surface of the rollable display.

3. The electronic device of claim 1, wherein RF transmission lines are configured not to overlap when the rollable display is in a state of being moved and/or pushed into the inside of the housing.

4. The electronic device of claim 3, wherein the RF transmission lines are disposed in the form of a straight line inclined in an oblique form on the rear surface of the rollable display.

5. The electronic device of claim 3, wherein the RF transmission lines are disposed in the form of a step inclined in an oblique form on the rear surface of the rollable display.

6. The electronic device of claim 3, wherein the RF transmission lines are disposed in the form of a curve inclined in an oblique form on the rear surface of the rollable display.

7. The electronic device of claim 1 further comprising a chip on panel (COP) disposed between at least the flexible circuit board and the rollable display, wherein the RF transmission lines are at least partially disposed on the COP.

8. The electronic device of claim 1, wherein the RF transmission lines are transitioned in a direction perpendicular to a rolling axis of the rollable display.

9. The electronic device of claim 1, wherein the RF transmission lines comprise a coaxial cable.

10. The electronic device of claim 1, wherein the RF transmission lines comprise a rectangular waveguide.

11. The electronic device of claim 1, wherein the RF transmission lines comprise a circular waveguide.

12. The electronic device of claim 1, wherein the RF transmission lines comprise a micro strip line and a ground line disposed with at least an insulating layer interposed therebetween in a vertical direction.

13. The electronic device of claim 1, wherein the RF transmission lines comprise a plurality of ground lines and a strip line disposed between at least the plurality of ground lines in a vertical direction.

14. The electronic device of claim 1, wherein the RF transmission lines comprise a Co-Planar Wave (CPW) guide.

15. An electronic device comprising: a cylindrical housing comprising a housing body comprising a cylindrical shape, wherein the body comprises a first side surface portion extending from one end and a second side surface portion extending from another end of the body and disposed in parallel with the first side surface portion; a rollable display configured to be rolled in an inner space of the cylindrical housing, and pulled from inside of the housing to at least partially outside of the housing, and to be pushed into the inside of the housing; radio frequency (RF) transmission lines disposed in a non-display area of the rollable display on a front surface of the rollable display; a plurality of antennas disposed on a side of the rollable display and electrically connected to a first side of the plurality of RF transmission lines; and a flexible circuit board electrically connected to a second side of the RF transmission lines.

16. The electronic device of claim 15, wherein the RF transmission lines are disposed in a bar shape from one side to another side of the rollable display on the front surface of the rollable display.

17. The electronic device of claim 15, wherein the RF transmission lines are configured not to overlap when the rollable display is in a state of being pushed into the inside of the housing.

18. The electronic device of claim 15 further comprising a chip on panel (COP) disposed between the flexible circuit board and the rollable display, wherein the RF transmission lines are at least partially disposed on the COP.

19. The electronic device of claim 15, wherein the RF transmission lines comprise at least one of a coaxial cable, a rectangular waveguide, a circular waveguide, and a Co-Planar Wave (CPW) guide.

20. The electronic device of claim 15, wherein the RF transmission lines comprise at least one micro strip line and at least one ground line disposed with an insulating layer interposed therebetween in a vertical direction.

* * * * *